(12) United States Patent
Watts et al.

(10) Patent No.: US 10,636,923 B2
(45) Date of Patent: Apr. 28, 2020

(54) PHOTOVOLTAIC MODULE ENCAPSULATION

(71) Applicant: OXFORD PHOTOVOLTAICS LIMITED, Oxfordshire (GB)

(72) Inventors: Jim Watts, Oxfordshire (GB); Thomas Sebastien, Oxfordshire (GB)

(73) Assignee: OXFORD PHOTOVOLTAICS LIMITED, Oxfordshire (GB)

( * ) Notice: Subject to any disclaimer, the term of this patent is extended or adjusted under 35 U.S.C. 154(b) by 43 days.

(21) Appl. No.: 16/062,360

(22) PCT Filed: Dec. 12, 2016

(86) PCT No.: PCT/EP2016/080701
§ 371 (c)(1),
(2) Date: Jun. 14, 2018

(87) PCT Pub. No.: WO2017/102669
PCT Pub. Date: Jun. 22, 2017

(65) Prior Publication Data
US 2019/0006547 A1 Jan. 3, 2019

(30) Foreign Application Priority Data
Dec. 14, 2015 (EP) ..................... 15199938

(51) Int. Cl.
*H02N 6/00* (2006.01)
*H01L 31/042* (2014.01)
(Continued)

(52) U.S. Cl.
CPC .... *H01L 31/0488* (2013.01); *B32B 17/10036* (2013.01); *B32B 17/1055* (2013.01);
(Continued)

(58) Field of Classification Search
CPC ..................... H01L 31/0488; B32B 17/10302
See application file for complete search history.

(56) References Cited

U.S. PATENT DOCUMENTS

| 2001/0038365 A1 | 11/2001 | Igeta |
| 2009/0142984 A1 | 6/2009 | Logunov et al. |
| (Continued) | | |

FOREIGN PATENT DOCUMENTS

| JP | 2007042460 A1 | 2/2007 |
| KR | 1020010098663 A | 11/2001 |
| (Continued) | | |

OTHER PUBLICATIONS

International Search Report and Written Opinion dated Jan. 13, 2017, from International Application No. PCT/EP2016/080701, 14 pages.

(Continued)

*Primary Examiner* — Angelo Trivisonno
(74) *Attorney, Agent, or Firm* — Meunier Carlin & Curfman LLC

(57) ABSTRACT

There is provided a method of encapsulating a photovoltaic module comprising a plurality of photovoltaic devices. The method comprises forming a wall of compact glass that extends from a periphery of a surface of a first glass sheet to a periphery of an opposing surface of a second glass sheet, the plurality of photovoltaic devices being located within a volume enclosed by the first glass, the second glass sheet and the wall of compact glass, wherein the wall of compact glass is formed from a plurality of courses of glass frit, and sealing the enclosed volume using laser-assisted glass frit bonding.

22 Claims, 13 Drawing Sheets

(51) Int. Cl.
H01L 31/048 (2014.01)
B32B 17/10 (2006.01)
(52) U.S. Cl.
CPC .... *B32B 17/10302* (2013.01); *H01L 31/0481* (2013.01); *Y02E 10/50* (2013.01)

(56) References Cited

U.S. PATENT DOCUMENTS

2013/0284266 A1 10/2013 Takeda et al.
2015/0053258 A1 2/2015 Beck

FOREIGN PATENT DOCUMENTS

| WO | 2008093962 A1 | 8/2008 |
| WO | 2011008905 A1 | 1/2011 |
| WO | 2013171517 A1 | 11/2013 |
| WO | 2014045021 A1 | 3/2014 |

OTHER PUBLICATIONS

Kojima, A. et al.; 2009. Organometal halide perovskites as visible-light sensitizers for photovoltaic cells. Journal of the American Chemical Society, 131(17), pp. 6050-6051.
Lee, M.M. et al.; 2012. Efficient hybrid solar cells based on meso-superstructured organometal halide perovskites. Science (New York, N.Y.), 338(6107), pp. 643-647.
Extended European Search Report dated Jun. 1, 2016, issued in EP Application No. 15199938.0, 8 pages.
First Office Action relating to Korean Application No. 1020187019292, dated Feb. 25, 2020.

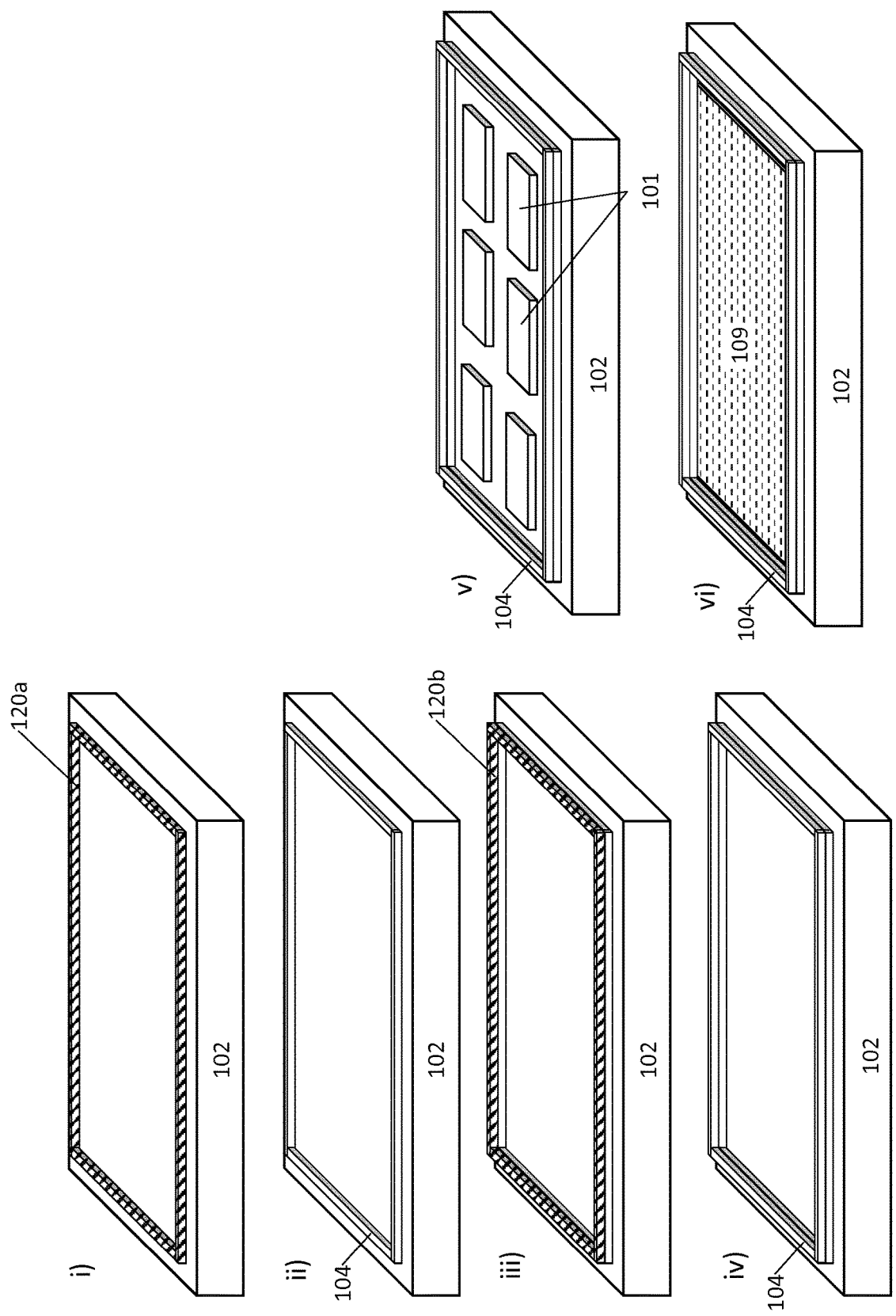

PHOTOVOLTAIC MODULE ENCAPSULATION

FIELD OF THE INVENTION

The present invention relates to a method of encapsulating a photovoltaic module and a photovoltaic module.

BACKGROUND OF THE INVENTION

A photovoltaic device, or solar cell, is device that converts the energy of light directly into electricity by the photovoltaic effect. A conventional photovoltaic system therefore comprises an array of photovoltaic modules, with each photovoltaic module comprising multiple photovoltaic devices integrated together and encapsulated to provide protection from both mechanical damage and the weather. FIG. 1 illustrates schematically (i.e. is a simplified representation that is not to scale) an example of a photovoltaic array comprising multiple photovoltaic modules, with each photovoltaic module comprising multiple photovoltaic devices.

FIG. 2 illustrates schematically an exploded view of an example of conventional photovoltaic module comprising multiple silicon solar cells. In such a conventional photovoltaic module, multiple silicon solar cells are sandwiched between an insulating back sheet and a transparent front sheet using adhesive encapsulant materials, such as poly ethylene-vinyl acetate (EVA) or polyvinyl butyral (or PVB), with an edge sealant (e.g. polyisobutylene, silicones and epoxy/acrylic resins) deposited around the periphery to provide some protection against the ingress of moisture. The components of such a conventional photovoltaic module are secured together in a lamination process that involves stacking the components together, applying a vacuum to remove any air and other volatiles, the application of pressure to ensure a good surface contact and adhesion between the different layers, and heating the components, typically to temperatures of around 160° C. for 15 to 30 minutes, to melt the layers of encapsulant material and the edge sealant to secure everything in place. To complete the module, a metal frame is then typically assembled around the edges of the module to increase mechanical stability and to facilitate mounting of the module, and a junction box is attached to an external surface of the module (typically the external face of the back sheet) that provides an electrical connection through the laminated structure with the photovoltaic devices contained within the module.

Whilst the encapsulation methods and materials used for conventional first generation photovoltaic modules is intended to provide some protection against the ingress of moisture this is largely in order to prevent the corrosion of the electrical connectors (e.g. conductive traces/wires/ribbons) that string together the photovoltaic devices within the module and to prevent moisture induced delamination, as silicon-based photovoltaic devices are not particularly sensitive to moisture. Consequently, the use of top and bottom layers of encapsulant material together with an edge sealant has been accepted as sufficient for conventional photovoltaic modules. In contrast, some of the second and third generation photovoltaic materials are highly sensitive to the effects of moisture, such that even the very low moisture-permeability and diffusivity sealant materials used in conventional photovoltaic modules do not provide sufficient protection against moisture to prevent degradation of these photovoltaic materials within the required lifetime of a module.

For example, one class of photovoltaic materials that has attracted significant interest has been the perovskites. Materials of this type form an $ABX_3$ crystal structure which has been found to show a favourable band gap, a high absorption coefficient and long diffusion lengths, making such compounds ideal as an absorber in photovoltaic devices. Early examples of the use of perovskite materials in photovoltaic application are reported by Kojima, A. et al., 2009. Organometal halide perovskites as visible-light sensitizers for photovoltaic cells. Journal of the American Chemical Society, 131(17), pp. 6050-1 in which hybrid organic-inorganic metal halide perovskites were used as the sensitizer in liquid electrolyte based photoelectrochemical cells. Kojima et al report that a highest obtained solar energy conversion efficiency (or power energy conversion efficiency, PCE) of 3.8%, although in this system the perovskite absorbers decayed rapidly and the cells dropped in performance after only 10 minutes.

Subsequently, Lee, M. M. et al., 2012. Efficient hybrid solar cells based on meso-superstructured organometal halide perovskites. Science (New York, N.Y.), 338(6107), pp. 643-7 reported a "meso-superstructured solar cell" in which the liquid electrolyte was replaced with a solid-state hole conductor (or hole-transporting material, HTM), spiro-MeOTAD. Lee et al reported a significant increase in the conversion efficiency achieved, whilst also achieving greatly improved cell stability as a result of avoiding the use of a liquid solvent. In the examples described, $CH_3NH_3PbI_3$ perovskite nanoparticles assume the role of the sensitizer within the photovoltaic cell, injecting electrons into a mesoscopic $TiO_2$ scaffold and holes into the solid-state HTM. Both the $TiO_2$ and the HTM act as selective contacts through which the charge carriers produced by photoexcitation of the perovskite nanoparticles are extracted.

Further work described in WO2013/171517 disclosed how the use of mixed-anion perovskites as a sensitizer/absorber in photovoltaic devices, instead of single-anion perovskites, results in more stable and highly efficient photovoltaic devices. In particular, this document discloses that the superior stability of the mixed-anion perovskites is highlighted by the finding that the devices exhibit negligible colour bleaching during the device fabrication process, whilst also exhibiting full sun power conversion efficiency of over 10%. In comparison, equivalent single-anion perovskites are relatively unstable, with bleaching occurring quickly when fabricating films from the single halide perovskites in ambient conditions.

More recently, WO2014/045021 described planar heterojunction (PHJ) photovoltaic devices comprising a thin film of a photoactive perovskite absorber disposed between n-type (electron transporting) and p-type (hole transporting) layers. Unexpectedly it was found that good device efficiencies could be obtained by using a compact (i.e. without effective/open porosity) thin film of the photoactive perovskite, as opposed to the requirement of a mesoporous composite, demonstrating that perovskite absorbers can function at high efficiencies in simplified device architectures.

Whilst the perovskite materials show significant potential for providing solar energy at a much lower cost than traditional technologies, they have been shown to be extremely sensitive to moisture induced degradation, which impacts on both the short-term and long-term stability of photovoltaic devices that make use of photoactive perovskite materials.

SUMMARY OF THE PRESENT INVENTION

In order to provide sufficient protection against moisture ingress, the inventors have recognised that glass frit bonding can provide hermetic seals that exclude both moisture and gas and could therefore provide a route for encapsulation of photovoltaic modules that will provide sufficient protection to moisture-sensitive photoactive materials. However, the present inventors have also recognised that the conventional approaches to glass frit bonding have limitations that are particularly problematic for a number of photovoltaic applications. In particular, glass frit bonding typically requires bonding temperatures of greater than 300° C., and often temperatures in excess of 450° C.; however, photoactive materials that are particularly sensitive to moisture, such as perovskites, will also suffer significant/catastrophic degradation at such high temperatures.

In addition, the present inventors have recognised that for a number of the envisaged applications of photoactive materials such as perovskites, conventional glass frit bonding approaches are not capable of bridging/spanning the distance that must be covered in order to encapsulate devices within a module. In particular, for a number of the envisaged applications of perovskite photoactive materials, the distance between the bonded surfaces of the module will be in the range of 50 µm to 800 µm, whereas conventional glass frit bonding typically provides a gap of 5 µm to 30 µm between the bonded surfaces. Whilst it may be possible to deposit a thicker/deeper seam/cord of glass frit in order to bond across broader gaps, conventional glass frit bonding approaches would then require significant heating of the deposited frit in order to melt the volume of glass frit sufficiently to form a consistent hermetic seal, and such heating would damage heat-sensitive components.

The present inventors have therefore developed a method of encapsulating a photovoltaic module that overcomes these problems. In particular, these methods allow for the formation of a hermetic seal between the front and back sheets of a module that are separated by relatively large distances (e.g. distances above 50 µm), whilst also avoiding exposing the photovoltaic devices that are to be contained within the module from being exposed to temperatures that would damage the photoactive materials (e.g. for perovskite materials, temperatures below 160° C. and preferably below 100° C.).

According to a first aspect there is provided a method of encapsulating a photovoltaic module comprising a plurality of photovoltaic devices. The method comprises forming a wall of compact glass that extends from a periphery of a surface of a first glass sheet to a periphery of an opposing surface of a second glass sheet, the plurality of photovoltaic devices being located within a volume enclosed by the first glass, the second glass sheet and the wall of compact glass, wherein the wall of compact glass is formed from a plurality of courses of glass frit, and sealing the enclosed volume/wall of compact glass using laser-assisted glass frit bonding. Preferably the wall of compact glass is formed from a plurality of courses of glass frit that are individually transformed into compact glass by heating in an oven or furnace. Preferably the distance extended by the wall is 50 µm or greater, is more preferably between 150 µm and 1000 µm, and is yet more preferably between 200 µm and 800 µm.

The wall of compact glass preferably surrounds the enclosed volume and is continuous. The wall of compact glass may project substantially perpendicularly relative to both the surface of the first glass sheet and to the opposing surface of the second glass sheet.

The step of forming a wall of compact glass may comprise any of forming the wall of compact glass on the first glass sheet; and forming a first partial height wall of compact glass on the first glass sheet and a second partial height wall of compact glass on the second glass sheet.

The method may comprise any of forming a wall of compact glass on the first glass sheet and subsequently using laser-assisted glass frit bonding to fuse the wall of compact glass to the second glass sheet; and forming a first partial height wall of compact glass on the first glass sheet, forming a second partial height wall of compact glass on the second glass sheet, and subsequently using laser-assisted glass frit bonding to fuse the first partial height wall of compact glass on the first glass sheet to the second partial height of compact glass on the second glass sheet.

The step of forming the wall of compact glass on the first glass sheet may comprise (i) depositing a course of glass frit paste around a periphery of the surface of the first glass sheet; and transforming the glass frit paste into compact glass by heating the first glass sheet in an oven or furnace. The step of forming a wall of compact glass on the first glass sheet may then further comprise repeating step (i) at least once. The step of forming a wall of compact glass on the first glass sheet may further comprise, at least once, depositing an additional course of glass frit paste onto the wall of compact glass; and transforming the additional course of glass frit paste into compact glass by heating the first glass sheet in an oven or furnace, thereby increasing the height of the wall of compact glass.

The step of step of sealing the enclosed volume using laser-assisted glass frit bonding may comprises providing thermally conditioned glass frit paste on the wall of compact glass; aligning the first glass sheet with the second glass sheet such that the wall of compact glass is in contact with the periphery of the second glass sheet; and using laser-assisted glass frit bonding to fuse the wall of compact glass provided on the first glass sheet to the second glass sheet by directing a laser at the thermally conditioned glass frit paste. The step of providing thermally conditioned glass frit paste on the wall of compact glass may comprise depositing glass frit paste onto the wall of compact glass, and implementing thermal conditioning of the glass frit paste, preferably wherein the thermal conditioning is implemented by heating in an oven or furnace.

The plurality of photovoltaic devices may be located on the first glass sheet after the step of providing thermally conditioned glass frit paste on the wall of compact glass; or the plurality of photovoltaic devices may be located on the second glass sheet prior to the step of bonding of the wall of compact glass formed on the first glass sheet to the periphery of the second glass sheet.

The step of sealing the enclosed volume using laser-assisted glass frit bonding may comprise providing thermally conditioned glass frit paste around the periphery of the second glass sheet; aligning the first glass sheet with the second glass sheet such that the wall of compact glass is in contact with the thermally conditioned glass frit paste provided around the periphery of the second glass sheet; and using laser-assisted glass frit bonding to fuse the wall of compact glass provided on the first glass sheet to the second glass sheet by directing a laser at the thermally conditioned glass frit paste.

The step of providing thermally conditioned glass frit paste around of the periphery of the second glass sheet may comprise depositing glass frit paste around of the periphery of the second glass sheet, and implementing thermal conditioning of the glass frit paste, preferably wherein the thermal conditioning is implemented by heating in an oven or furnace. The step of providing thermally conditioned glass frit paste around of the periphery of the second glass sheet may comprise depositing glass frit paste at a location around a periphery of the second glass sheet that corresponds with the location of the wall of compact glass formed around the periphery of the first glass sheet.

The plurality of photovoltaic devices may then be located on the first glass sheet after the step of forming a wall of compact around the periphery of the first glass sheet; or the plurality of photovoltaic devices may be located on the second glass sheet after the step of providing thermally conditioned glass frit paste around of the periphery of the second glass sheet.

The step of forming a first partial height wall of compact glass on the first glass sheet may comprise (i) depositing a course of glass frit paste around a periphery of the surface of the first glass sheet; and transforming the glass frit paste into compact glass by heating the first glass sheet in an oven or furnace. The step of forming a second partial height wall of compact glass on the second glass sheet may then comprises (ii) depositing a course of glass frit paste around a periphery of the opposing surface of the second glass sheet; and transforming the glass frit paste into compact glass by heating the second glass sheet in an oven or furnace. The step of forming a wall of compact glass may further comprise repeating one or both of steps (i) and (ii) at least once.

The step of forming a first partial height wall of compact glass on the first glass sheet may comprise, at least once, depositing an additional course of glass frit paste onto the first partial height wall of compact glass; and transforming the additional course of glass frit paste into compact glass by heating the first glass sheet in an oven or furnace, thereby increasing the height of the first partial height wall of compact glass. The step of forming a second partial height wall of compact glass on the second glass sheet may comprise, at least once, depositing an additional course of glass frit paste onto the second partial height wall of compact glass; and transforming the additional course of glass frit paste into compact glass by heating the second glass sheet in an oven or furnace, thereby increasing the height of the second partial height wall of compact glass.

The step of step of sealing the enclosed volume using laser-assisted glass frit bonding may comprise providing thermally conditioned glass frit paste on one of the first partial height wall of compact glass and the second partial height wall of compact glass; aligning the first glass sheet with the second glass sheet such that the first partial height wall of compact glass in contact with the second partial height wall of compact glass; and using laser-assisted glass frit bonding to fuse the first partial height wall of compact glass to the second partial height wall of compact glass by directing a laser at the thermally conditioned glass frit paste.

The step of providing thermally conditioned glass frit paste on one of the first partial height wall of compact glass and the second partial height wall of compact glass may comprise depositing glass frit paste onto one of the first partial height wall of compact glass and the second partial height wall of compact glass, and implementing thermal conditioning of the glass frit paste, preferably wherein the thermal conditioning is implemented by heating in an oven or furnace.

The method may further comprise, prior to sealing the enclosed volume using laser-assisted glass frit bonding, locating the plurality of photovoltaic devices on one of the first glass sheet and the second glass sheet and then laminating the photovoltaic module in order to bond the first glass sheet and the second glass sheet together using at least one layer of an encapsulant material. The step laminating the photovoltaic module may comprise applying heat and pressure sufficient to melt the at least one layer of an encapsulant material, and cooling the photovoltaic module sufficiently in order to solidify the molten encapsulant material.

The method may further comprise, after locating the plurality of photovoltaic devices on one of the first glass sheet and the second glass sheet, applying a layer of encapsulant material over the plurality of photovoltaic devices, locating the other of the first glass sheet and the second glass sheet over the layer of encapsulant material over, and applying heat and pressure sufficient to melt the layer of encapsulant material. The step of locating the plurality of photovoltaic devices on one of the first glass sheet and the second glass sheet may comprise forming the plurality of photovoltaic devices on a surface of the one of the first glass sheet and the second glass sheet. The step of locating the plurality of photovoltaic devices on one of the first glass sheet and the second glass sheet may comprise positioning the plurality of photovoltaic devices on one of the surface of the first glass sheet and the opposing surface of the second glass sheet.

The method may further comprise applying a first layer of encapsulant material on one of the surface of first glass sheet and the opposing surface of the second glass sheet, locating the plurality of photovoltaic devices on the first layer of encapsulant material, applying a second layer of encapsulant material over the plurality of photovoltaic devices, locating the other of the first glass sheet and the second glass sheet over the second layer of encapsulant material, and applying heat and pressure sufficient to melt both the first and second layers of encapsulant material.

The wall of compact glass may be formed from a first glass frit paste, and the step of sealing the enclosed volume using laser-assisted glass frit bonding may make use of a second glass frit paste, wherein the first glass frit paste and second glass frit paste are the same or different.

According to a second aspect there is provided a photovoltaic module comprising a wall of compact glass that extends from a periphery of a surface of a first glass sheet to a periphery of an opposing surface of a second glass sheet; and a plurality of photovoltaic devices located within a volume enclosed by the first glass, the second glass sheet and the wall of compact glass; wherein the distance extended by the wall of compact glass is 50 µm or greater. Preferably, the wall of compact glass is fused to the surface of the first glass sheet and to the opposing surface the second glass sheet. Preferably the distance extended by the wall is between 150 µm and 1000 µm, and is more preferably between 200 µm and 800 µm.

Preferably, the wall of compact glass projects substantially perpendicularly relative to both the surface of the first glass sheet and to the opposing surface of the second glass sheet. The thickness of the wall of compact glass may be less than 5 mm, and is preferably between 1 mm and 3 mm.

The photovoltaic module may further comprise at least one layer of encapsulant material disposed between the plurality of photovoltaic devices and one of the first glass sheet and the second glass sheet. The photovoltaic module may then comprise a first layer of encapsulant material disposed between the plurality of photovoltaic devices and the first glass sheet and a second layer of encapsulant material disposed between the plurality of photovoltaic devices the second glass sheet.

Optionally, one or more of the plurality of photovoltaic devices are multi-junction photovoltaic devices, and the plurality of photovoltaic devices are then preferably bonded to both the first glass sheet and the second glass sheet by at least one layer of encapsulant material.

Optionally, one or both of the first glass sheet and second glass sheet comprise a sheet of heat-strengthened or fully tempered glass and each of the plurality of photovoltaic devices comprise a thin film photovoltaic device.

Optionally, the plurality of photovoltaic devices are formed directly on one of the surface of the first glass sheet and the opposing surface of the second glass sheet, and a layer of encapsulant material is then preferably disposed between the plurality of photovoltaic devices and the other of the surface of the first glass sheet and the opposing surface of the second glass sheet.

Preferably, at least one of the first glass sheet and second glass sheet is provided with through-holes extending from an external surface to the volume enclosed, and the photovoltaic module further comprises one or more electrical connectors passing through each of the through-holes, and one or more sealants materials disposed within each of the through-holes and filling any void between the sides of the through-hole and the electrical connector, and preferably comprising a first sealant material disposed at an inner/distal end of the through-hole adjacent the enclosed volume and a second sealant material disposed at the outer/proximal end of the through-hole adjacent to the external surface of the module.

BRIEF DESCRIPTION OF THE DRAWINGS

The present invention will now be more particularly described by way of example only with reference to the accompanying drawings, in which:

FIGS. 6a to 6c illustrate schematically a step-by-step implementation of an alternative example of the method of encapsulating a photovoltaic module described herein.

DETAILED DESCRIPTION

Definitions

Figure 1:
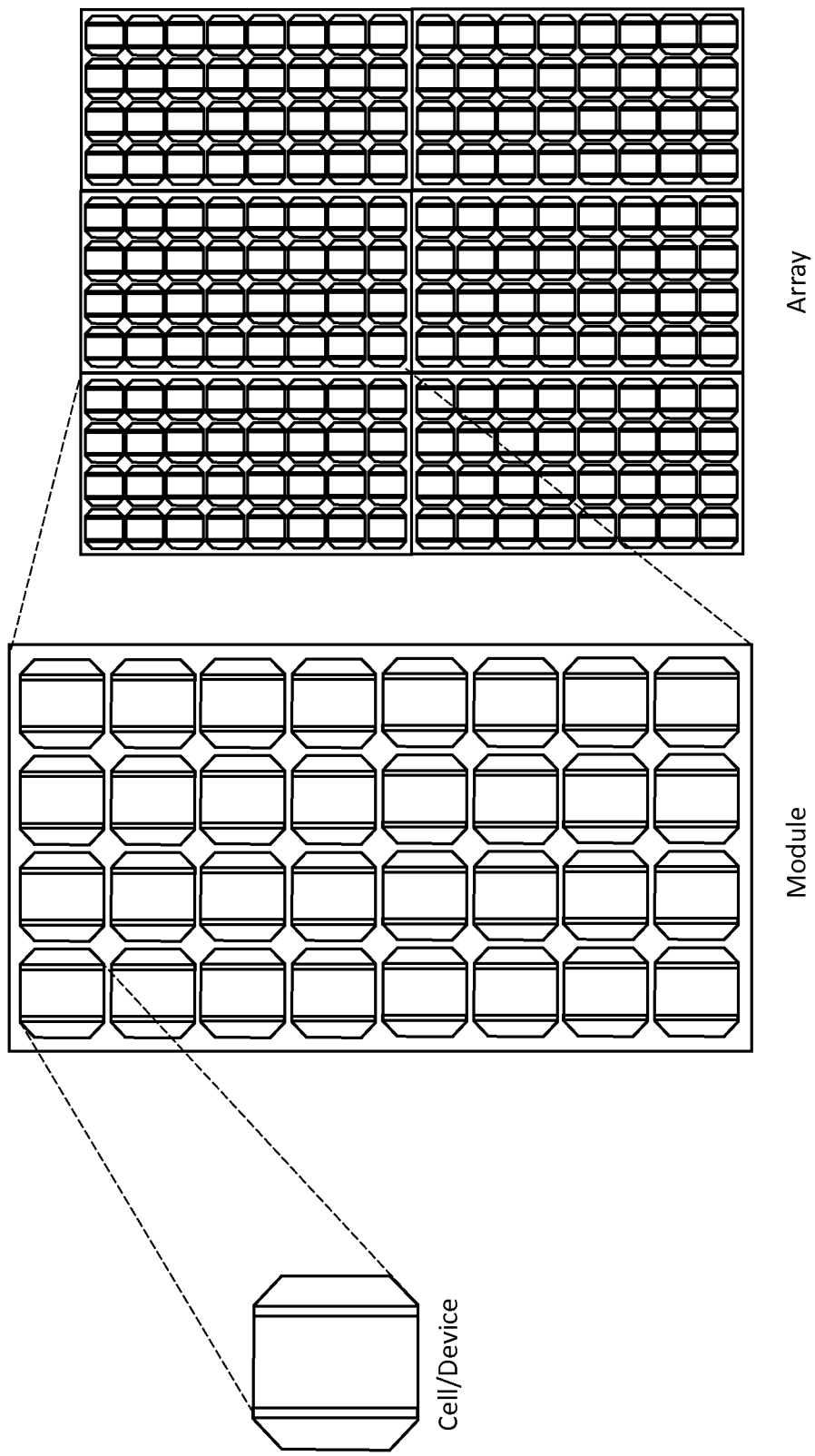
FIG. 1 illustrates schematically an example of a photovoltaic array comprising multiple photovoltaic modules, with each photovoltaic module comprising multiple photovoltaic devices.
Figure 2:
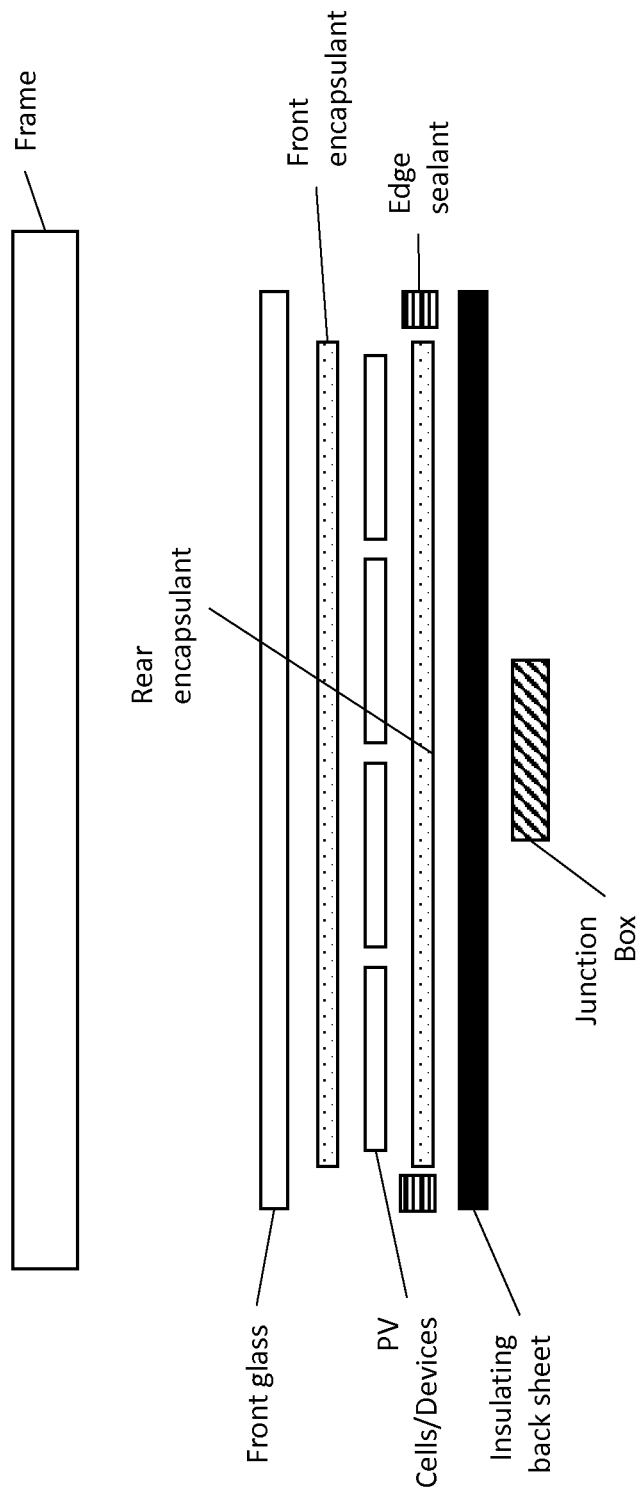
FIG. 2 illustrates schematically an exploded view of an example of conventional photovoltaic module comprising multiple solar cells.

The term "photovoltaic" refers to the generation of electricity as a result of exposure to light. The term "photovoltaic device" therefore refers to a device that converts the energy of light directly into electricity by the photovoltaic effect, and is synonymous with term "solar cell".

The term "photovoltaic module", as used herein, then refers to a unit comprising multiple photovoltaic devices integrated together and encapsulated to provide protection from both mechanical damage and the weather. A photovoltaic module is therefore a packaged, connected assembly of multiple photovoltaic devices in which the photovoltaic devices are the smallest functional unit.

The term "encapsulation", as used herein, refers to the enclosing of one or more objects such that they are surrounded on all sides.

The term "glass frit", as used herein, refers to finely powdered low-temperature melting point glasses that when heated will soften and flow to form a seal or a coating. Glass frits are used to join glass to other glasses, ceramics, or metals. To ensure stress-free sealing, the coefficient of thermal expansion (CTE) of the glass frit needs to be closely matched to that of the materials being bonded. Glass frit are always applied as a paste or ink rather than as a powder. The term "glass frit pate", as used herein, therefore refers to a viscous substance comprising the glass frit, and one or more additional materials that are selected so as to achieve suitable properties for the paste. For example, a glass frit paste typically comprises a glass frit mixed with a binder to form a paste, one or more solvents for tuning/adjusting the viscosity of the paste, and one or more filler materials for tuning/adjusting the coefficient of thermal expansion (CTE) of the glass frit. Glass frit pastes may be applied by a variety of techniques (screen printing, doctor-blading, nozzle dispensing, etc).

The term "sheet", as used herein, refers to a broad flat piece of material, such as metal or glass, wherein each of the broad surfaces of the sheet are referred to herein as a "face" of the sheet, and the each of the narrow surfaces of the sheet are referred to herein as an "edge" of the sheet The term "wall", as used herein, refers to an object or a structure that projects substantially vertically (i.e. perpendicularly) relative to the surface on which the object or structure is provided. The term "course", as used herein, refers to a continuous horizontal (i.e. relative to the vertical projection of the wall) layer of material in a wall.

The term "fuse", as used herein, refers to a process that results in two or more objects being join or blended so as to effectively be a single entity (i.e. to coalesce). The term "sinter", as used herein, refer to a process by which a powdered material coalesces into a solid or porous mass by means of heating (and usually also compression) without liquefaction.

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "perovskite", as used herein, refers to a material with a three-dimensional crystal structure related to that of $CaTiO_3$ or a material comprising a layer of material, which layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (1/2, 1/2, 1/2) and the X anions are at (1/2, 1/2, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$ type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprises more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will often be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$.

Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is [2-(1-cyclohexenyl)ethylammonium]$_2$PbBr$_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite material employed in embodiments of the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite.

As the skilled person will appreciate, the perovskite material employed in embodiments of the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in embodiments of the present invention is a photosensitizing material, i.e. a material which is capable of performing both photogeneration and charge transportation.

The term "consisting essentially of" refers to a composition comprising the components of which it consists essentially as well as other components, provided that the other components do not materially affect the essential characteristics of the composition. Typically, a composition consisting essentially of certain components will comprise greater than or equal to 95 wt % of those components or greater than or equal to 99 wt % of those components.

Module Structure

Figure 3A:
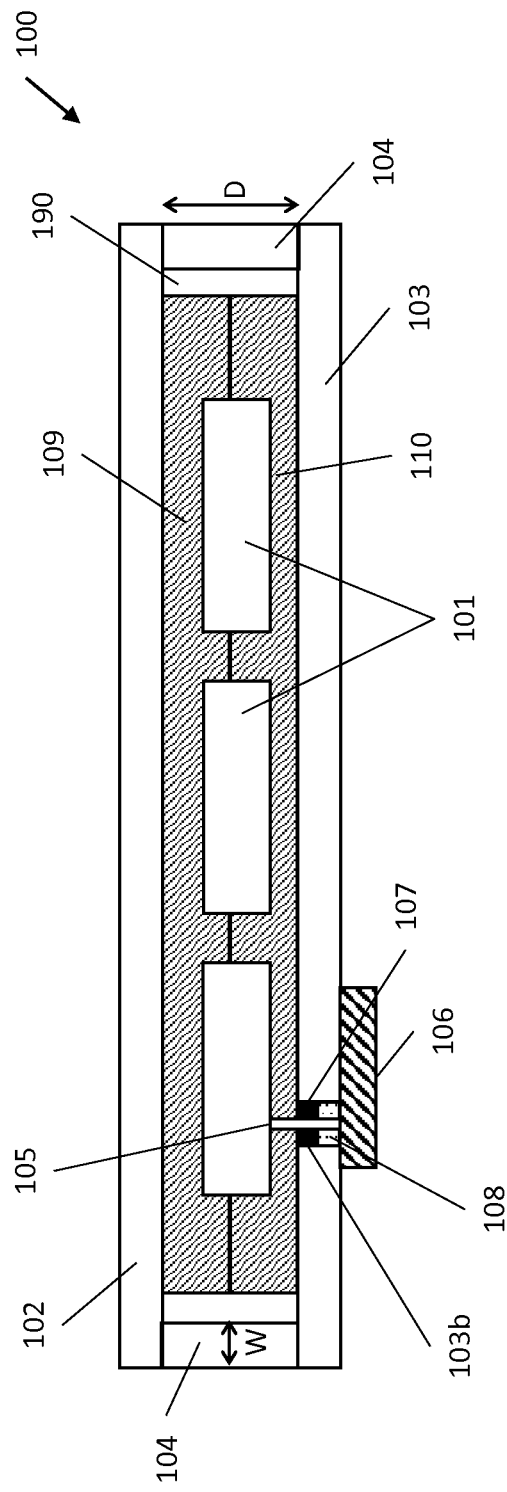
FIG. 3a illustrates schematically a cross-section of an example of a photovoltaic module that has been encapsulated using the methods described herein.
Figure 3B:
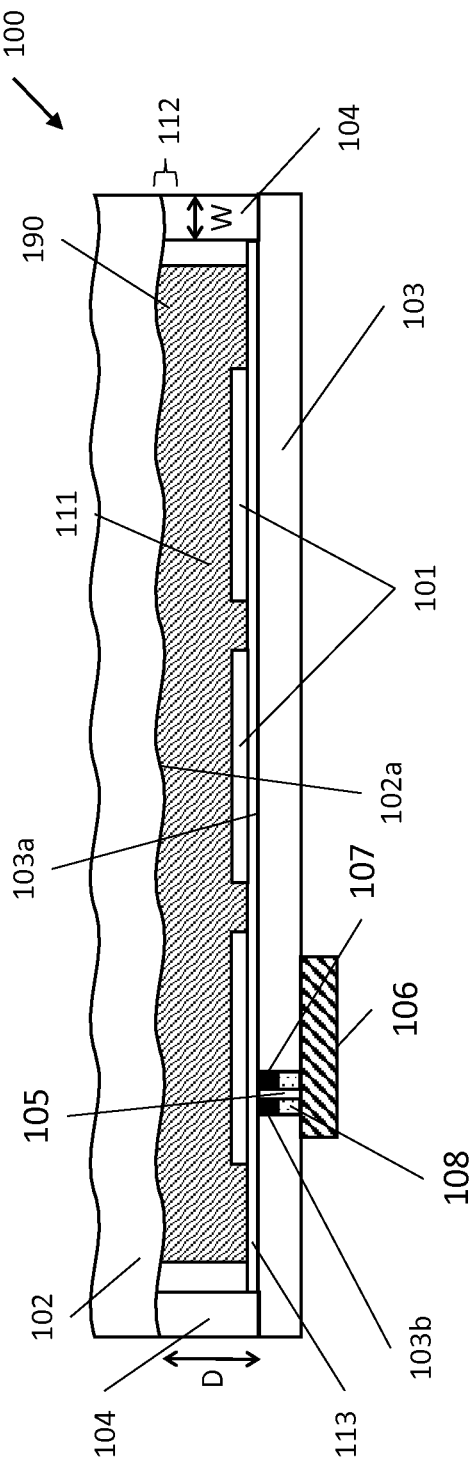
FIG. 3b illustrates schematically a cross-section of a further example of a photovoltaic module that has been encapsulated using the methods described herein.

FIGS. 3a and 3b each illustrate schematically examples of a photovoltaic module 100 comprising a plurality of photovoltaic devices 101 that have been encapsulated between a first glass sheet 102 and a second glass sheet 103 using the methods described herein. In particular, in both FIGS. 3a and 3b the a photovoltaic module 100 comprises a wall of compact/bulk glass 104 extends from a periphery of a surface 102a of a first glass sheet 102 to a periphery of an opposing surface 103a of a second glass sheet 103, and the plurality of photovoltaic devices 101 are located within a volume 190 enclosed by the first glass 102, the second glass sheet 103 and the wall of compact glass 104, wherein the distance (D) between the first glass sheet 102 and the second glass sheet 103 is 50 μm or greater. The height of/depth of/distance (D) extended by the wall 104 is therefore 50 μm or greater. Preferably, the distance (D) between the first glass sheet 102 and the second glass sheet 103, and therefore the height of/depth of/distance (D) extended by the wall 104, is between 50 μm and 1300 μm, is more preferably between 150 μm and 1000 μm, and is yet more preferably between 200 μm and 800 μm.

The wall of compact glass 104 is unbroken/continuous. In addition, a first end of the wall of compact glass 104 is fused to the surface 102a of the first glass sheet 102 and a second end of the wall of compact glass 104 is fused to the opposing surface 103a the second glass sheet 103. The wall of compact/bulk glass 104 therefore forms an enclosure/barrier, such that the first glass sheet 102, the second glass sheet 103 and the wall of compact/bulk glass 104 cooperate/combine to enclose the space/volume 190 defined between them. Preferably, the wall of compact glass 104 projects substantially perpendicularly relative to both the surface 102a of the first glass sheet 102 and to the opposing surface 103a of the second glass sheet 103.

The plurality of photovoltaic devices 101 are attached/affixed to one or both of the first glass sheet 102 and the second glass sheet 103 within the volume enclosed 190 by the first glass sheet 102, the second glass sheet 103 and the wall of compact glass 104. The plurality of photovoltaic devices 101 are therefore attached/affixed to an internal face of one or both of the first glass sheet 102 and the second glass sheet 103, whilst the wall of compact glass 104 projects substantially perpendicularly between the internal face of the first glass sheet 102 (i.e. surface 102a) and the internal face of the second glass sheet 103 (i.e. surface 103a). It should be noted that the schematic illustrations given in the figures do not show any of the interconnections that would be present between at least some of the photovoltaic devices 101. In this regard, when fully configured within a module, some or all of photovoltaic devices 101 within the module 100 will be 'strung' together by electrical interconnections that extend between the positive electrode of one photovoltaic device and the negative electrode of an adjacent photovoltaic device.

In photovoltaic modules that have been encapsulated using conventional techniques and materials, the edge sealant that seals the periphery of the module is typically at least 10 mm wide/thick as such thicknesses are necessary in order to reduce the risk that moisture will penetrate through the edge sealant within the required minimum lifetime of the module. In contrast, in a photovoltaic module that has been encapsulated using the methods described herein, the hermetic seal provided by the wall of compact/bulk glass 104 provides that the width (W) of the wall of compact glass 104 can be less than 5 mm in order to maximise the surface area available within the module 100 for photovoltaic devices 101, referred to as the 'active aperture' of the module. The methods described herein thereby increase the overall active area per module and correspondingly increase the power density generation per module. Preferably, the width (W) of the wall of compact glass 104 is between 1 mm and 3 mm in order to provide an optimal balance between the available surface area within the module 100 and the mechanical strength of the bond between the first glass sheet 102 and the second glass sheet 103.

In order to maximise the available surface area within the module 100 the wall of compact glass 104 extends from a periphery of the surface 102a of the first glass sheet 102 to a periphery of the opposing surface 103a of the second glass sheet 103. In this regard, depending upon the accuracy of the method of deposition, it may be necessary for the wall of compact/bulk glass 104 to be formed around the periphery of the glass sheets up to 2 mm away from the edge of a glass sheet. However, even if such a gap/bare border between the edge of a glass sheet and the wall of compact glass 104 is required, the overall surface area of the module consumed by this edge seal would be significantly reduced when compared with the surface area consumed by conventional edge sealing techniques. By way of example, for a module that is 1 m×1.5 m in size, a reduction in the width of the edge seal from a typical 12 mm to 5 mm (i.e. a 2 mm gap and a 3 mm wide wall of compact glass) would increase the available active area of the module from 96.04% of the total area to 98.34%, leading to a 2.3% increase in power generation density.

In the illustrated embodiments the second glass sheet 103 is provided with one or more through-holes 103b extending from an external face of the second glass sheet 103 to the volume 190 enclosed within module 100. One or more electrical connectors 105 pass through each of the through-holes 103b, with each electrical connector 105 contacting a tabbing wire (not shown) connected to one or more of the plurality of photovoltaic devices 101. A junction box 106 is then attached/affixed to an external surface of the module 100 over one or more of the through-holes 103b, with the electrical connector 105 being connected to the junction box 106. Preferably, the junction box 106 is attached/affixed to an external face of the module 100 by a sealant material (not shown).

In an alternative embodiment, the first glass sheet 102 could be provided with one or more through-holes extending from an external face of the first glass sheet 102 to the volume 190 enclosed within module 100. The one or more electrical connectors 105 would then pass through each of the through-holes in the first glass sheet 102 and would be connected to a junction box 106 attached/affixed to the external face of the first glass sheet 102.

One or more sealants materials are disposed within each of the through-holes 103b, filling any void between the sides of the through-hole 103b and the electrical connector 105. Preferably the one or more sealants materials comprise both a first sealant material 107 disposed at an inner/distal end of the through-hole 103b adjacent the enclosed volume 190 and a second sealant material 108 disposed at the outer/proximal end of the through-hole 103b adjacent to the external surface of the module 100. In particular, the use of both a first sealant material 107 and a second sealant material 108 to seal a through-hole 103b provides that the first sealant material 107 disposed at an inner/distal end of the through-hole 103b can be selected so as to be compatible with the photovoltaic/photoactive materials used in the devices (i.e. to be inert with respect to these materials), whilst the second sealant material 108 can be freely selected from those materials that provide the best barrier to moisture vapour. In addition, the use of both a first sealant material 107 and a second sealant material 108 to seal a through-hole 103b allows for sealant materials of different mechanical strengths (tensile modulus) to be selected, which would be beneficial in providing protection for the potentially delicate electrical connectors 105 that pass through each of the through-holes 103b.

Figure 4B:
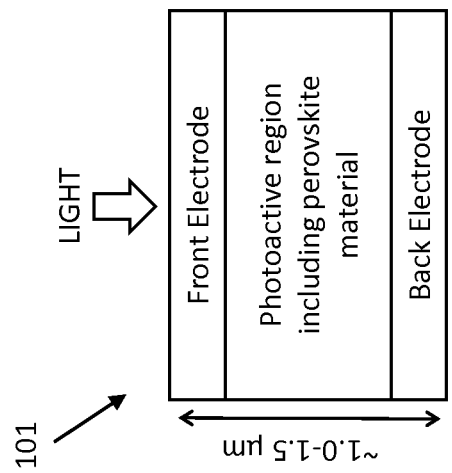
FIG. 4b illustrates schematically an example of a thin film photovoltaic device.
Figure 4A:
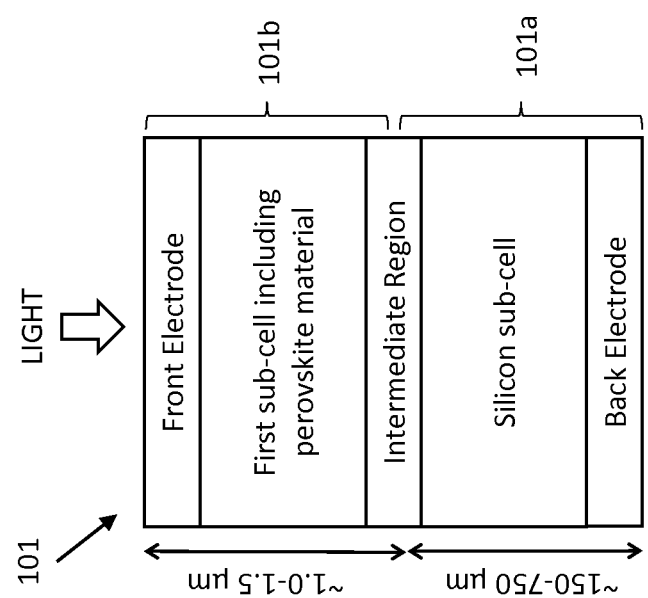
FIG. 4a illustrates schematically an example of a multi-junction photovoltaic device.

In the example of FIG. 3a the plurality of photovoltaic devices 101 are relatively thick, having a depth of between 150 μm and 1000 μm. For example, this would typically be the case for a photovoltaic module 100 in which the plurality of photovoltaic devices 101 are multi-junction/tandem photovoltaic devices that each comprise a perovskite sub-cell and a silicon sub-cell. As illustrated schematically in FIG. 4a, in such multi-junction/tandem photovoltaic devices the silicon sub-cell 101a would typically have a thickness/depth of 150 μm to 750 μm, whilst the thickness/depth of the perovskite sub-cell 101b would be around 1 μm to 1.5 μm (not shown to scale). These multi-junction/tandem photovoltaic devices, including tabbing wire, would therefore have a total thickness/depth of around of between 150 μm and 1000 μm, and typically between 200 μm and 800 μm. Consequently, in this example the distance (D) between the first glass sheet 102 and the second glass sheet 103, and therefore the height of/depth of/distance (D) extended by the wall 104, will be at least 150 μm, will typically be between 150 μm and 1000 μm, and will more typically be between 200 μm and 800 μm.

In the example of FIG. 3a, the plurality of photovoltaic devices 101 are attached/affixed to both of the first glass sheet 102 and the second glass sheet 103. In particular, the plurality of photovoltaic devices 101 are affixed to the internal faces of each of the first glass sheet 102 and the second glass sheet 103 using respective first and second layers of interlayer/encapsulant material 109, 110. For example, the first and second layers of interlayer/encapsulant material 109, 110 could each comprise any one of a thermoplastic/hot melt adhesive and a thermoset/cross-linking adhesive. In particular, the first and second layers of interlayer/encapsulant material 109, 110 could each comprise any one of poly ethylene-vinyl acetate (EVA), polyvinyl butyral (PVB), polydimethylsiloxane (PDMS), polyisobutylene (FIB), polyolefin, thermoplastic polyurethane (TPU), polyurethane, epoxy, silicone, or an ionomer etc.

In the example of FIG. 3a, the plurality of photovoltaic devices 101 would be attached/affixed to both of the first glass sheet 102 and the second glass sheet 103 by a lamination process. In particular, this lamination process would involve applying a first layer of interlayer/encapsulant material on one of the first glass sheet 102 and the second glass sheet 103 and subsequently locating the plurality of photovoltaic devices 101 on the first layer of interlayer/encapsulant material. A second layer of interlayer/encapsulant material would then be applied over/above the plurality of photovoltaic devices 101, and the other of the first glass sheet 102 and the second glass sheet 103 stacked over/above the second layer of interlayer/encapsulant material before pressure and heat is applied to the stacked components to melt the first and second layers of interlayer/encapsulant material 109, 110 such that they flow together and become one solid mass when cooled. In this way, the plurality of photovoltaic devices 101 are laminated between the two layers of encapsulant material 109, 110, and the layers of encapsulant material 109, 110 act so as to bond the first glass sheet 102 and the second glass sheet 103 to one another.

In an alternative embodiment of the example of FIG. 3a, the plurality of photovoltaic devices 101 could be affixed to the internal faces of each of the first glass sheet 102 and the second glass sheet 103 by a lamination process using just a single layer of interlayer/encapsulant material. For example, in this alternative embodiment, the lamination process would involve locating the plurality of photovoltaic devices 101 on one of the first glass sheet 102 and the second glass sheet 103, applying a layer of interlayer/encapsulant material over/above the plurality of photovoltaic devices 101, and then stacking the other of the first glass sheet 102 and the second glass sheet 103 over/above the layer of interlayer/encapsulant material before pressure and heat is applied to the stacked components. In this embodiment, the layer of interlayer/encapsulant material would extend over and beyond the plurality of photovoltaic devices 101 such that the lamination process would cause the layer of interlayer/encapsulant material to melt and adhere to the plurality of photovoltaic devices 101, to the internal surface of the glass sheet stacked above the plurality of photovoltaic devices 101, and to the internal surface of glass sheet located below the plurality of photovoltaic devices 101 that is not covered by the plurality of photovoltaic devices 101.

In the example of FIG. 3b, the plurality of photovoltaic devices 101 are relatively thin, having a depth of between 1 μm and 2 μm; however, one or both of the first glass sheet 102 and the second glass sheet 103 comprise a sheet of heat-strengthened/toughened/tempered glass having roller wave distortion 112. Roller wave distortion is the periodic wave or corrugations imparted to glass as it softens during a heat-strengthening or tempering process due to the glass sagging slightly between the rolls used to transport the glass through a furnace. Whilst the degree of roller wave distortion present on a sheet of heat-strengthened or tempered glass will generally depend on the radius of the rollers used to transport the glass through the furnace, roller wave distortion typically results in a peak-to-valley variation in the surface profile (i.e. the total height of the profile, $R_t$) of between 0.1 mm (100 μm) and 0.5 mm (500 μm). Consequently, in this example the distance (D) between the first glass sheet 102 and the second glass sheet 103, and therefore the height of/depth of/distance (D) extended by the wall 104, will be at least 150 μm, will typically be between 150 μm and 1000 μm, and will more typically be between 200 μm and 800 μm. For example, at least one sheet of heat-strengthened or tempered glass would typically be used in a photovoltaic module intended for building-integrated photovoltaic (BIPV) applications. For such applications the photovoltaic devices used in the module would then typically comprise a thin film photovoltaic device such as that illustrated schematically in FIG. 4b.

In the example of FIG. 3b, the plurality of photovoltaic devices 101 are attached/affixed to both of the first glass sheet 102 and the second glass sheet 103. In particular, the plurality of photovoltaic devices 101 are affixed to the internal face of the second glass sheet 103 by being formed on the internal face of the second glass sheet 103. In this regard, the photovoltaic devices 101 are formed on the internal face of the second glass sheet 103 by sequentially depositing each of the layers making up the devices 101 onto a face of the second glass sheet 103. A layer of an interlayer/encapsulant material 111 is then applied over the top of the photovoltaic devices 101 provided on the internal face of the second glass sheet 103 and the first glass sheet 102 is stacked over/above the layer of interlayer/encapsulant material 111 before pressure and heat is applied to the stacked components. For example, the layer of interlayer/encapsulant material 111 could comprise any one of a thermoplastic/hot melt adhesive and a thermoset/cross-linking adhesive. In particular, the layer of interlayer/encapsulant material 111 could comprise any one of poly ethylene-vinyl acetate (EVA), polyvinyl butyral (PVB), polydimethylsiloxane (PDMS), polyisobutylene (PIB), polyolefin, thermoplastic polyurethane (TPU), polyurethane, epoxy, silicone, or an ionomer etc.

In the examples illustrated in FIGS. 3a and 3b, the lamination of the stacked components of the module, including one or two layers of interlayer/encapsulant material, not only attaches/affixes the plurality of photovoltaic devices 101 to one or both of the first glass sheet 102 and the second glass sheet 103, but also act so as to bond the first glass sheet 102 and the second glass sheet 103 to one another to provide mechanical integrity for the module 100.

In the examples illustrated in FIGS. 3a and 3b, one or more of the plurality of photovoltaic devices 101 may comprise a photoactive region that comprises a photoactive perovskite material. In such devices the perovskite material is configured to function as a light absorber/photosensitizer within the photoactive region. In addition, the perovskite material in the photoactive region may also be configured to provide charge transport. In this regard, perovskite materials are able to act not only as a light absorber (i.e. photosensitizer) but also as an n-type, p-type or intrinsic (i-type) semiconductor material (charge transporter). The perovskite material may therefore assume the roles both of light absorption and long range charge transport. The photoactive perovskite material preferably has a three-dimensional crystal structure. The photoactive perovskite material then preferably has the general formula (I):

$$[A][B][X]_3 \qquad (I)$$

wherein [A] is at least one monovalent cation, [B] is at least one divalent inorganic cation, and [X] is at least one halide or pseudohalide anion.

Method of Encapsulation

A method of encapsulating a photovoltaic module 100 comprising a plurality of photovoltaic devices/cells 101 as disclosed herein will now described. The method comprises forming a wall of compact glass 104 that extends from the periphery of a surface 102a of a first glass sheet 102 to the periphery of an opposing surface 103a of a second glass sheet 103, the plurality of photovoltaic devices 101 being located within a volume 190 enclosed by the first glass 102, the second glass sheet 103 and the wall of compact glass 104, wherein the wall of compact glass 104 is formed from a plurality of courses of glass frit. The enclosed volume 190 is then sealed using laser-assisted glass frit bonding. Laser-assisted glass frit bonding comprises using a laser beam to locally heat and thereby melt a glass frit in order to fuse two glass surfaces together.

The wall of compact glass 104 is formed so that it is unbroken/continuous. In addition, the processes of forming the wall 104 and/or sealing the wall 104 ensure that a first end of the wall of compact glass 104 is fused to the surface 102a of the first glass sheet 102 and a second end of the wall of compact glass 104 is fused to the opposing surface 103a the second glass sheet 103. The wall of compact/bulk glass 104 therefore forms an enclosure/barrier, such that the first glass sheet 102, the second glass sheet 103 and the wall of compact/bulk glass 104 cooperate/combine to enclose the space/volume 190 defined between them. Preferably, the wall of compact glass 104 projects substantially perpendicularly relative to both the surface 102a of the first glass sheet 102 and to the opposing surface 103a of the second glass sheet 103.

The wall of compact glass 104 is formed from a plurality of courses/seams of glass frit. In this regard, the plurality of courses/seams of glass frit will each individually be transformed into compact/bulk glass by heating in an oven/furnace.

The distance (D) between the first glass sheet 102 and the second glass sheet 103, and therefore the height of/depth of/distance (D) extended by the wall 104, will be at least 50 µm, will typically be between 150 µm and 1000 µm, and will more typically be between 200 µm and 800 µm.

Formation of Glass Wall

In a first embodiment, the step of forming a wall of compact/bulk glass 104 may comprise forming the wall of compact glass 104 on the first glass sheet 102. In this case, the step of using laser-assisted glass frit bonding to seal the enclosed volume 190 will then comprise using laser-assisted glass frit bonding to bond/fuse the wall of compact glass 104 to the opposing surface 103a of the second glass sheet 103.

The step of forming a wall of compact glass around the periphery of the first glass sheet may therefore comprise applying/dispensing/depositing a course/seam of glass frit paste around a periphery of the first glass sheet, and transforming the course/seam of glass frit paste into compact glass by heating the first glass sheet in an oven/furnace. In this regard, a glass frit paste typically comprises glass frit and one or more additional materials. For example, the one or more additional materials may comprise any of a binder, one or more solvents, and one or more filler materials.

The step of transforming the glass frit paste into compact glass by heating the first glass sheet in an oven/furnace may then comprise thermally conditioning the glass frit paste. Thermal conditioning comprises subjecting the deposited glass frit paste to a temperature-time profile that prepares the glass frit paste for fusing/bonding. At the very least, thermal conditioning removes some of the one or more additional materials so that the thermally conditioned glass frit paste can then be melted to form compact glass without voids/inclusions. In particular, where the glass frit paste includes a binder and/or one or more solvents, the thermal conditioning process typically comprises a first step of heating the glass frit paste to a first temperature that is sufficient to evaporate the one or more solvents (thereby drying the glass frit paste), followed by a second step of heating the glass frit paste to a second temperature that is sufficient to burn out any binder materials.

Depending upon the specific content of the glass frit paste and the application for which it is being used, thermal conditioning of the glass frit paste may then further comprise a third step in which the glass frit paste is sintered, in a process referred to as "glazing" or "pre-melting". This third step would therefore typically comprise heating the glass frit paste to a third temperature that is sufficient to significantly reduce the viscosity of the glass frit, such that the particles of glass frit powder will have begun to change in shape and to form an initial adhesion to each other and to the surface on which the glass frit has been deposited, providing a degree of mechanical stability that can maintain the shape of the glass frit as deposited.

In order to ensure that the wall of compact glass 104 is of sufficient height/depth to cover the distance required between the first glass sheet 102 and the second glass sheet 103, the step of forming a wall of compact glass 104 around the periphery of the first glass sheet 102 may comprise sequentially repeating the steps of applying/dispensing/depositing a course of glass frit paste around a periphery of the first glass sheet 102 and transforming the glass frit paste into compact glass by heating the first glass sheet 102 in an oven/furnace. These steps will then be sequentially repeated until the wall of compact glass 104 is of sufficient height/depth. The step of forming a wall of compact glass 104 around the periphery of the first glass sheet 102 may therefore further comprise, at least once, applying/dispensing/depositing an additional course of glass frit paste onto the wall of compact glass 104, and transforming the additional course of glass frit paste into compact glass by heating the first glass sheet 102 in an oven/furnace, and thereby increasing the height of the wall of compact glass 104.

In a second embodiment, the step of forming a wall of compact glass 104 may comprise forming a first partial height wall of compact glass on the first glass sheet 102 and forming a second partial height wall of compact glass on the second glass sheet 103. In this case, the step of using laser-assisted glass frit bonding to seal the enclosed volume 190 will then comprise using laser-assisted glass frit bonding to bond the first partial height wall of compact glass on the first glass sheet 102 to the second partial height wall of compact glass on the second glass sheet 103. The first partial height wall of compact glass and the second partial height wall of compact glass will therefore be bonded/fused together to form the wall of compact glass 104. The first partial height wall of compact glass therefore comprises a first part of the wall compact glass and the second partial height wall of compact glass comprises a second part of the wall compact glass.

The step of forming a first partial height wall of compact glass on the first glass sheet may then comprise applying/dispensing/depositing a course of glass frit paste around a periphery of the surface of the first glass sheet; and transforming the glass frit paste into compact glass by heating the first glass sheet in an oven/furnace.

The step of forming a second partial height wall of compact glass on the second glass sheet may comprise applying/dispensing/depositing a course of glass frit paste around a periphery of the opposing surface of the second glass sheet; and transforming the glass frit paste into compact glass by heating the second glass sheet in an oven/furnace.

In order to ensure that the wall of compact glass 104 is of sufficient height/depth to cover the distance required between the first glass sheet 102 and the second glass sheet 103, the step of forming a first partial height wall of compact glass around the periphery of the first glass sheet 102 may comprise sequentially repeating the steps of applying/dispensing/depositing a course of glass frit paste around a periphery of the first glass sheet 102 and transforming the glass frit paste into compact glass by heating the first glass sheet 102 in an oven/furnace. Alternatively, or in addition the step of forming a second partial height wall of compact glass around the periphery of the second glass sheet 103 may comprise sequentially repeating the steps of applying/dispensing/depositing a course of glass frit paste around a periphery of the second glass sheet 103 and transforming the glass frit paste into compact glass by heating the second glass sheet 103 in an oven/furnace. These steps can then be sequentially repeated until the first partial height wall of compact glass and the second partial height wall of compact glass are of sufficient height/depth to ensure that the wall of compact glass 104 is of sufficient height/depth.

The step of forming a first partial height wall of compact glass on the first glass sheet 102 may therefore further comprise, at least once, applying/dispensing an additional course of glass frit paste onto the first partial height wall of compact glass; and transforming the additional course of glass frit paste into compact glass by heating the first glass sheet 102 in an oven/furnace, thereby increasing the height of the first partial height wall of compact glass. Alternatively, or in addition, the step of forming a second partial height wall of compact glass on the second glass sheet 103 may further comprise, at least once, applying/dispensing an additional course of glass frit paste onto the second partial height wall of compact glass; and transforming the additional course of glass frit paste into compact glass by heating the second glass sheet 103 in an oven/furnace, thereby increasing the height of the second partial height wall of compact glass.

Sealing of the Module

In embodiments in which the laser-assisted glass frit bonding is used to bond/fuse the wall of compact glass 104 to the opposing surface 103a of the second glass sheet 103, the step of sealing the enclosed volume 190 using laser-assisted glass frit bonding may comprise providing a thermally conditioned glass frit paste on the wall of compact glass 104, aligning the first glass sheet 102 with the second glass sheet 103 such that the wall of compact glass 104 is in contact with the periphery of the second glass sheet 103, and directing a laser beam at the thermally conditioned glass frit paste in order to fuse/bond the second glass sheet 103 to the wall of compact glass 104 provided on the first glass sheet 102. The laser beam will locally heat and thereby melt the thermally conditioned glass frit paste in order to fuse the wall of compact glass 104 to the second glass sheet 103 and thereby seal the enclosed volume 190.

The step of providing thermally conditioned glass frit paste on the wall of compact glass 104 may then comprise applying/dispensing/depositing a course/seam of glass frit paste onto the wall of compact glass 104, and implementing thermal conditioning of the glass frit paste, preferably wherein the thermal conditioning is implemented by heating in an oven/furnace. The thermally conditioned glass frit paste therefore comprises a glass frit paste that has been subjected to a temperature-time profile that prepares the glass frit paste for fusing/bonding. As detailed above, at the very least, thermal conditioning removes some of the one or more additional materials so that the thermally conditioned glass frit paste can then be melted to form compact glass without voids/inclusions. Typically, this thermal conditioning of the glass frit paste comprises a first step of heating the glass frit paste to a first temperature that is sufficient to evaporate the one or more solvents (thereby drying the glass frit paste), followed by a second step of heating the glass frit paste to a second temperature that is sufficient to burn out the binder.

Alternatively, the step of sealing the enclosed volume 190 using laser-assisted glass frit bonding may comprise providing thermally conditioned glass frit paste around the periphery of the second glass sheet 103, aligning the first glass sheet 102 with the second glass sheet 103 such that the wall of compact glass 104 is in contact with the thermally conditioned glass frit paste provided around the periphery of the second glass sheet 102, and directing a laser beam at the thermally conditioned glass frit paste in order to fuse the second glass sheet 103 to the wall of compact glass 104 provided on the first glass sheet 102 and thereby seal the enclosed volume 190.

In this embodiment, the step of providing thermally conditioned glass frit paste around of the periphery of the second glass sheet 103 may comprise applying/dispensing/depositing a course of glass frit paste at a position/location around a periphery of the second glass sheet 103 that corresponds with the position/location of the wall of compact glass 104 formed around the periphery of the first glass sheet 102. This step may then further comprise implementing thermal conditioning of the glass frit paste, preferably wherein the thermal conditioning is implemented by heating in an oven/furnace.

In alternative embodiments in which laser-assisted glass frit bonding is used to fuse/bond the first partial height wall of compact glass on the first glass sheet 102 to the second partial height wall of compact glass on the second glass sheet 103, the step of step of sealing the enclosed volume using laser-assisted glass frit bonding may comprise providing a thermally conditioned glass frit paste on one of the first partial height wall of compact glass and the second partial height wall of compact glass, aligning the first glass sheet with the second glass sheet such that the first partial height wall of compact glass in contact with the second partial height wall of compact glass, and using laser-assisted glass frit bonding to bond the first partial height wall of compact glass to the second partial height wall of compact glass by directing a laser (i.e. a laser beam/laser radiation) at the thermally conditioned glass frit paste.

In this embodiment, the step of providing thermally conditioned glass frit paste on one of the first partial height wall of compact glass and the second partial height wall of compact glass may comprise applying/dispensing glass frit paste onto one of the first partial height wall of compact glass and the second partial height wall of compact glass, and implementing thermal conditioning of the glass frit paste, preferably wherein the thermal conditioning is implemented by heating in an oven/furnace.

In the above described embodiments, the wall of compact glass 104 may be formed from a first glass frit paste, whilst the thermally conditioned glass frit paste used to implement the laser-assisted glass frit bonding may be a second glass frit paste. The first glass frit paste and second glass frit paste may be the same or different.

Locating the Photovoltaic Devices

In embodiments in which the step of sealing the enclosed volume 190 using laser-assisted glass frit bonding comprises providing thermally conditioned glass frit paste on the wall of compact glass 104, the plurality of photovoltaic devices 101 may be located on the first glass sheet 102 after the step of providing thermally conditioned glass frit paste on the wall of compact glass 104 (and prior to the lamination and sealing of the module). Locating the photovoltaic devices 101 on the first glass sheet 102 after the thermal conditioning of the glass frit paste avoids exposing the devices 101 to the temperatures used during the thermal conditioning of the glass frit paste. Alternatively, the plurality of photovoltaic devices 101 may be located on the second glass sheet 103 prior to the step of bonding of the wall of compact glass 104 formed on the first glass sheet 102 to the periphery of the second glass sheet 103. Locating the photovoltaic devices 101 on the second glass sheet 103 rather than the first glass sheet 102 also provides that the devices 101 will not be exposed to the temperatures used during the thermal conditioning of the glass frit paste deposited on the first glass sheet 102.

In embodiments in which the step of sealing the enclosed volume 190 using laser-assisted glass frit bonding comprises providing thermally conditioned glass frit paste around the periphery of the second glass sheet 103, the plurality of photovoltaic devices 101 may be located on the first glass sheet 102 after the step of forming a wall of compact 104 around the periphery of the first glass sheet 102 (and prior to lamination and sealing of the module). Locating the photovoltaic devices 101 on the first glass sheet 102 after the formation of the wall of compact glass 104 avoids exposing the devices 101 to the temperatures required to transform the glass frit into compact glass. Alternatively, the plurality of photovoltaic devices 101 may be located on the second glass sheet 103 after the step of providing thermally conditioned glass frit paste around of the periphery of the second glass sheet 103. Locating the photovoltaic devices 101 on the second glass sheet 103 rather than the first glass sheet 102 after the thermal conditioning of the glass frit paste avoids exposing the devices 101 to the temperatures required to at least partially thermally condition the glass frit paste.

In embodiments in which the step of sealing the enclosed volume 190 using laser-assisted glass frit bonding comprises providing thermally conditioned glass frit paste on one of a first partial height wall of compact glass and a second partial height wall of compact glass, the plurality of photovoltaic devices 101 may be located on either the first glass sheet 102 or the second glass sheet 103 after the step of forming a partial height wall of compact glass on the respect glass sheet. If the thermally conditioned glass frit paste to be used in the laser-assisted glass frit bonding step is provided on the first partial height wall of compact glass, then the plurality of photovoltaic devices 101 can either be located on the first glass sheet 102 after the thermally conditioned glass frit paste has been provided on the first partial height wall of compact glass or they can be located on the second glass sheet 103. Alternatively, if the thermally conditioned glass frit paste to be used in the laser-assisted glass frit bonding step is provided on the second partial height wall of compact glass, then the plurality of photovoltaic devices 101 can either be located on the second glass sheet 103 after the thermally conditioned glass frit paste has been provided on the second partial height wall of compact glass or they can be located on the first glass sheet 102

Additional Steps

In embodiments in which the thermally conditioned glass frit paste that is used to implement the laser-assisted glass frit bonding is provided on the wall of compact glass 104 formed on the first glass sheet 102 the method may further comprise, prior to bonding the wall of compact glass 104 to the periphery of the second glass sheet 103, roughening the periphery of the second glass sheet 103. Similarly, in embodiments in which the thermally conditioned glass frit paste that is used to implement the laser-assisted glass frit bonding is provided around the periphery of the second glass sheet 103 the method may further comprise, prior to providing the thermally conditioned glass frit paste around the periphery of the second glass sheet 103, roughening the periphery of the second glass sheet 103. The method may also further comprise, prior to forming the wall of compact/bulk glass 104 around the periphery of the first glass sheet 102, roughening the periphery of a first glass sheet 102.

In embodiments in which the step of forming a wall of compact glass 104 comprises forming a first partial height wall of compact glass on the first glass sheet 102 and forming a second partial height wall of compact glass on the second glass sheet 103 the method may further comprise, prior to forming the first partial height wall of compact glass on the first glass sheet 102, roughening the periphery of the first glass sheet 102. Similarly, the method may further comprise, prior to forming a second partial height wall of compact glass on the second glass sheet 103, roughening the periphery of the second glass sheet 103.

Any of these roughening steps roughening step may be implemented using an edge deletion process, such as grinding, sandblasting, laser etching, chemical etching etc. Any of these roughening steps may therefore also remove any coatings applied to the glass prior to encapsulation. This may be particularly relevant in embodiments in which the photovoltaic devices 101 are formed directly on an internal face of either the first glass sheet 102 or the second glass sheet 103 as face of the glass sheet on which the devices are formed may be provided with one or more surface coatings that would be detrimental to the formation of a hermetic bond/seal between the two glass sheets. By way of example, as illustrated in FIG. 3b, the internal face of the glass sheet on which the devices are formed may be provided with a surface coating of a layer of a transparent conductive oxide (TCO) 113 such as tin-doped indium-oxide (ITO), fluorine doped tin oxide (FTO) etc. that is used to provide an electrode for each of the devices subsequently formed on the glass sheet.

EXAMPLES

Examples of the method of encapsulating a photovoltaic module will now described with reference to FIGS. 5a to 5c, 6a to 6c, and 7a to 7c. In particular, FIGS. 5a to 5c illustrate schematically a step-by-step implementation of an example of the method of encapsulating a photovoltaic module as described herein.

Figure 5A:
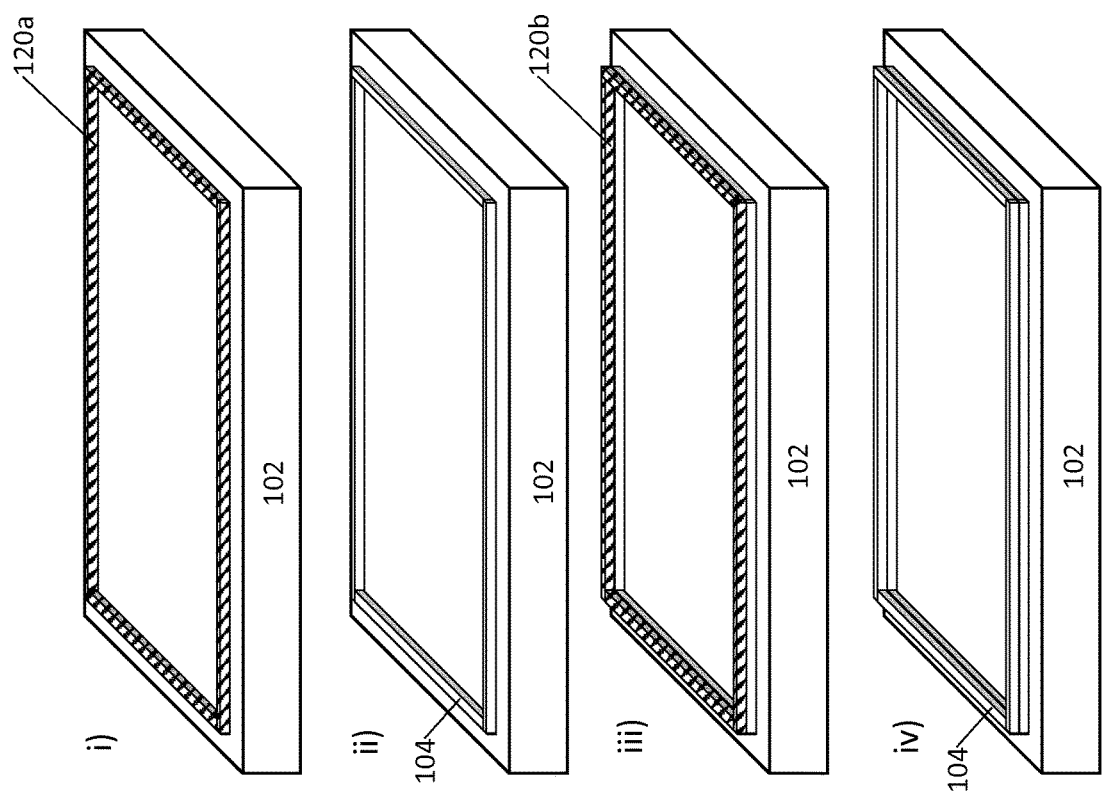
FIGS. 5a to 5c illustrate schematically a step-by-step implementation of an example of the method of encapsulating a photovoltaic module as described herein.

In step (i) of FIG. 5a a course/seam of a first glass frit paste 120a is deposited/applied around the periphery of the first glass sheet 102. For example, the course of the first glass frit paste 120a could be deposited by methods such as screen printing, nozzle dispensing etc. In step (ii) the first glass sheet 102 is then placed in an oven/furnace and heated in order to transform the first glass frit paste 120a provided around the periphery of the first glass sheet 120 into a wall of compact glass 104. To do so, an oven/furnace is used to implement thermal conditioning and melting of the first glass frit paste 120a. In step (iii) of FIG. 5a, an additional course/seam of the first glass frit paste 120b is then deposited/applied onto the wall of compact glass 104 that has been formed around the periphery of the first glass sheet 102. In step (iv) of FIG. 5a, the first glass sheet 102 is then again placed in an oven/furnace and heated in order to transform the additional course/seam of the first glass frit paste 120b provided on the wall of compact glass 104 into more compact glass by the application of a time-temperature profile that is suitable for thermal conditioning and melting of the first glass frit paste 120. The application and thermal processing of an additional course/seam of the first glass frit paste 120b onto the wall of compact glass 104 thereby increases the overall height of/depth of (D) the wall of compact glass 104.

Figure 5B:
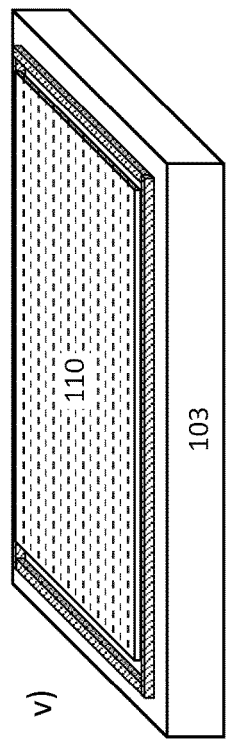
Figure 5B:
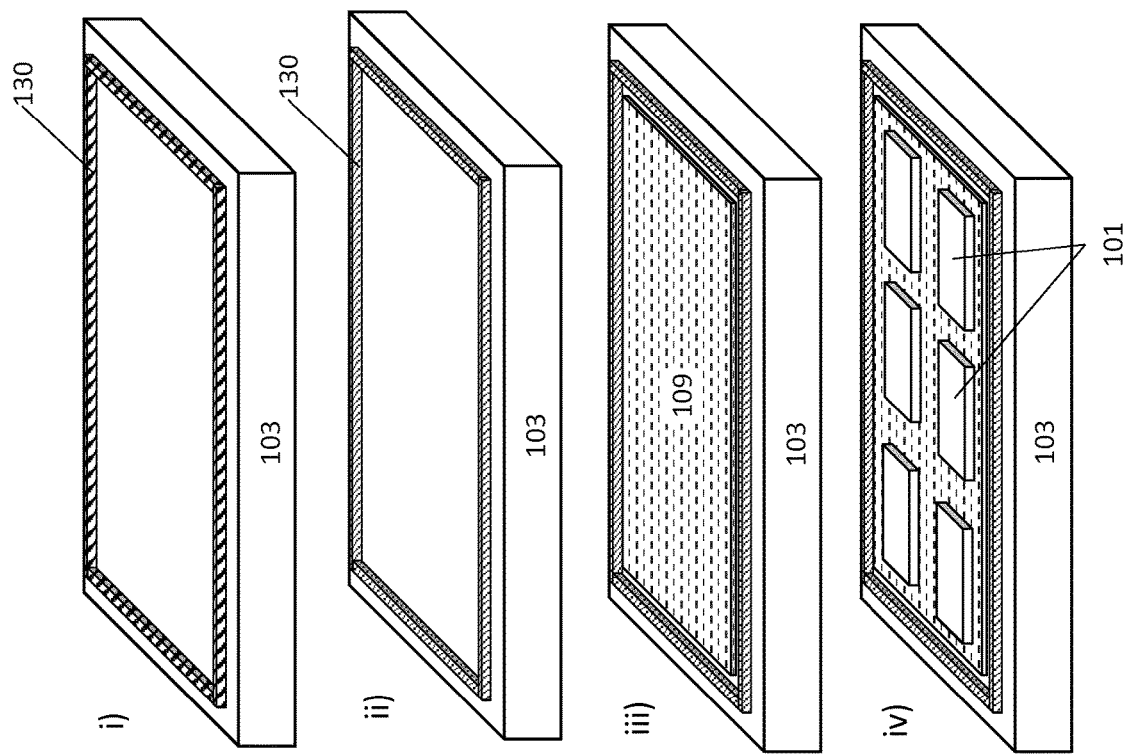

In step (i) of FIG. 5b a line/seam of a second glass frit paste 130 is deposited/applied around the periphery of the second glass sheet 103. In step (ii) the second glass sheet 103 is then placed in an oven/furnace and heated in order to thermally condition the second glass frit paste 130. In step (iii) of FIG. 5b, a first layer of interlayer/encapsulant material 109 is applied to the face of the second glass sheet 103 within the area bound by the course/seam of the second glass frit paste 130. In step (iv) of FIG. 5b the plurality of photovoltaic devices 101 are then located on the second glass sheet 103 by placing the plurality of photovoltaic devices 101 on the first layer of interlayer/encapsulant material 109. In step (v) of FIG. 5b a second layer of interlayer/encapsulant material 110 is applied over the plurality of photovoltaic devices 101.

Figure 5C:
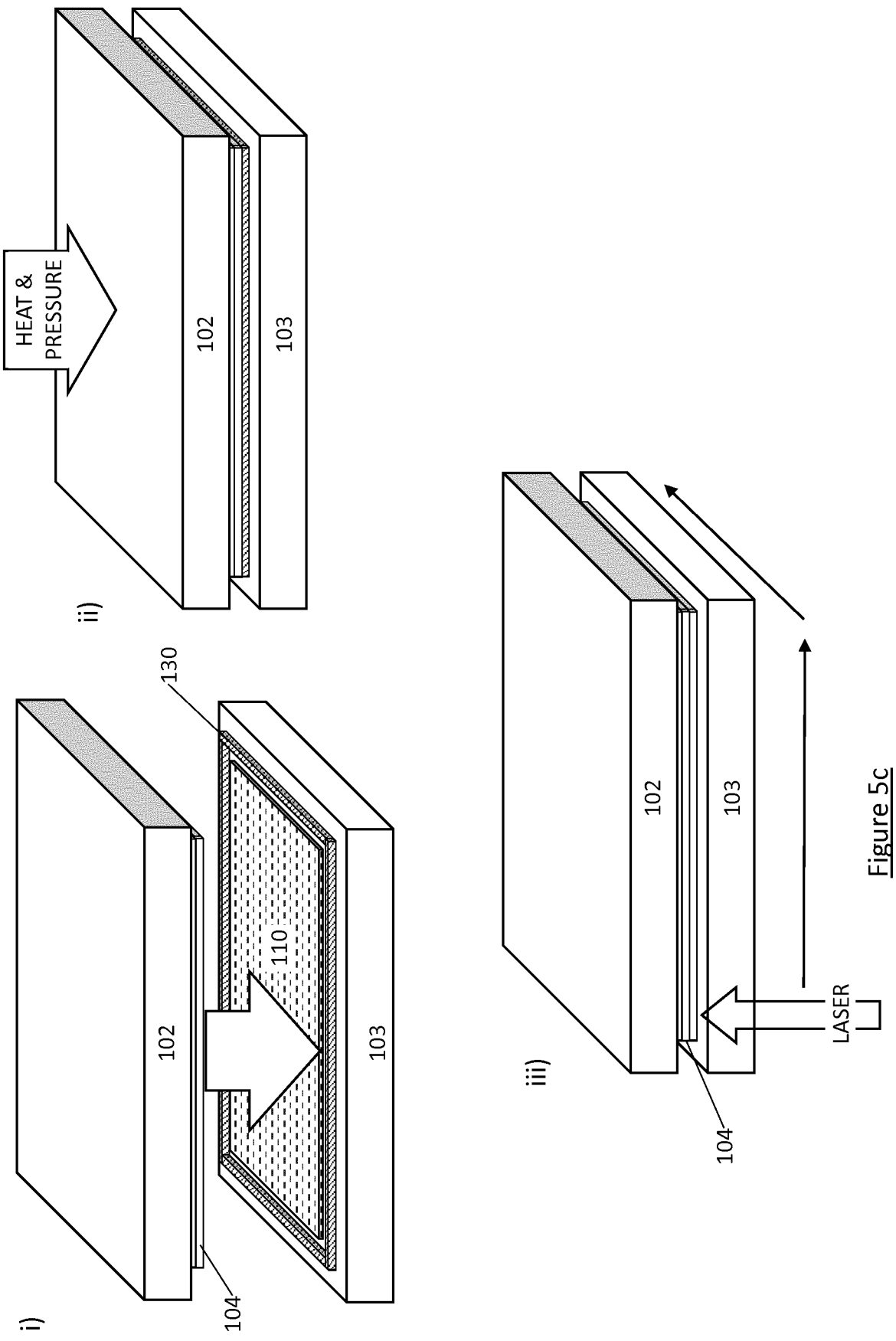

In step (i) of FIG. 5c the first glass sheet 102 on which the wall of compact glass 104 has been formed is aligned with the second glass sheet 103 such that the wall of compact glass 104 is in contact with the thermally conditioned second glass frit paste 130 provided around the periphery of the second glass sheet 103. In step (ii) of FIG. 5c the stacked components of the module 100 are then subjected to a lamination process in which pressure and heat is applied to the stacked components to melt the first and second layers of interlayer/encapsulant material 109, 110 such that they flow together and become one solid mass when cooled. In step (iii) of FIG. 5c a laser beam is directed at the thermally conditioned second glass frit paste 130, and moved along the entire course/seam of thermally conditioned second glass frit paste 130 so as to melt the thermally conditioned second glass frit paste 130 in order to fuse/bond the second glass sheet 103 to the wall of compact glass 104 provided on the first glass sheet 102. The bond between the wall of compact glass 104 and each of the first glass sheet 102 and second glass sheet 103 therefore forms a hermetic seal around the entire periphery of the module 100. In step (iii) of FIG. 5c the laser beam is directed at the thermally conditioned second glass frit paste 130 through the second glass sheet 103, so that the laser beam does not have to pass through the wall of compact glass 104 formed on the first glass sheet 102.

In order to implement laser-assisted glass frit bonding, the glass through which the laser beam is directed must be virtually transparent to the wavelength of the laser in order to maximise the amount of laser energy that reaches the thermally conditioned glass frit paste 130. The laser beam and the glass frit must also be selected so that the glass frit will absorb the wavelength of the laser light and convert the energy into heat that is sufficient to melt the glass frit.

Figure 6B:
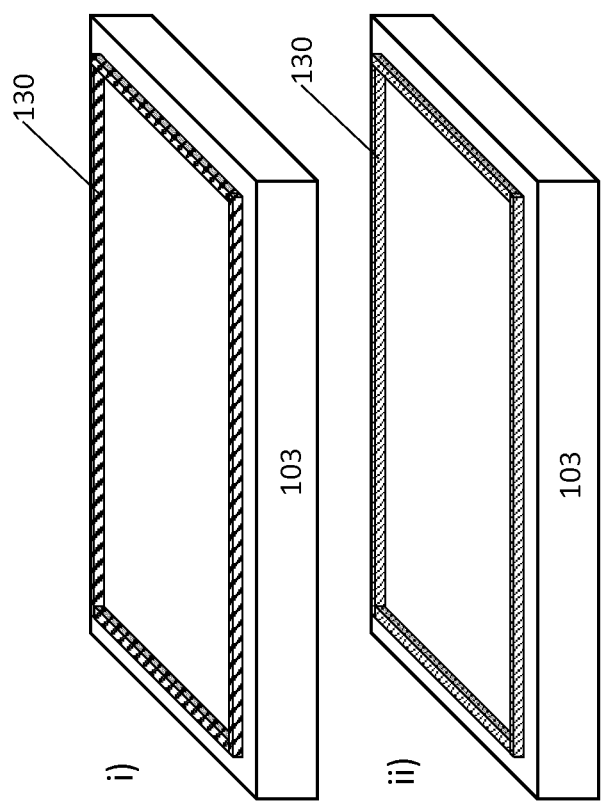
Figure 6C:
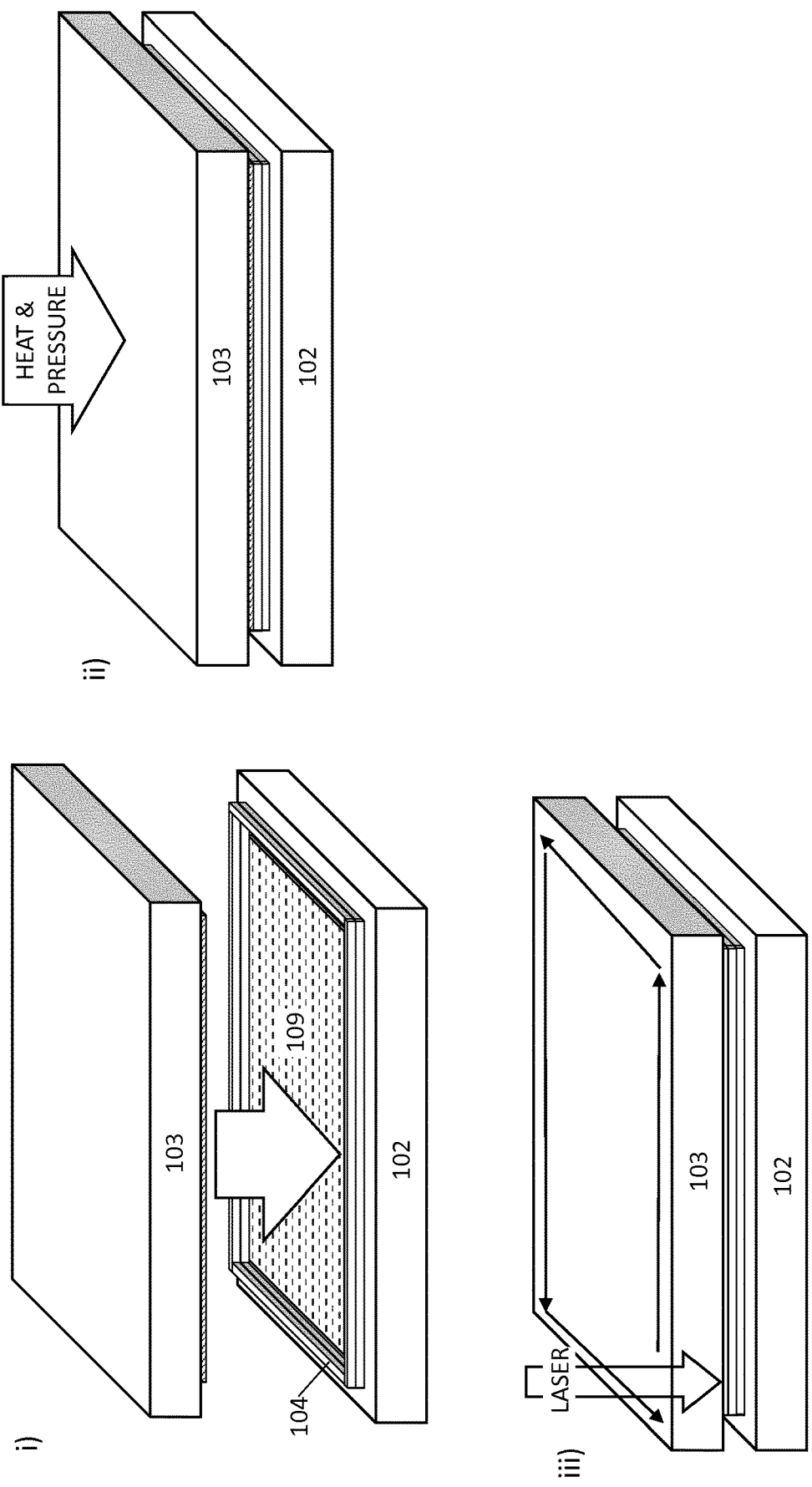

FIGS. 6a to 6c illustrate schematically a step-by-step implementation of an alternative example of the method of encapsulating a photovoltaic module described herein.

In step (i) of FIG. 6a a course/seam of a first glass frit paste 120a is deposited/applied around the periphery of the first glass sheet 102. In step (ii) the first glass sheet 102 is then placed in an oven/furnace and heated in order to transform the course/seam of a first glass frit paste 120a provided around the periphery of the first glass sheet 102 into a wall of compact glass 104. In step (iii) of FIG. 6a, an additional course/seam of the first glass frit paste 120b is then deposited/applied onto the wall of compact glass 104 that has been formed around the periphery of the first glass sheet 102. In step (iv) of FIG. 6a, the first glass sheet 102 is then again placed in an oven/furnace and heated in order to transform the additional course/seam of the first glass frit paste 120b provided on the wall of compact glass 104 into compact glass by the application of a time-temperature profile that is suitable for thermal conditioning and melting of the first glass frit paste 120. The application and thermal processing of an additional course/seam of the first glass frit paste 120b onto the wall of compact glass 104 thereby increases the overall height of/depth of (D) the wall of compact glass 104.

In step (v) of FIG. 6a the plurality of photovoltaic devices 101 are then located on the first glass sheet 102 by placing the plurality of photovoltaic devices 101 on the first glass sheet 102 within the area bound by the wall of compact glass 104. In step (vi) of FIG. 6a, a layer of interlayer/encapsulant 109 is applied over the plurality of photovoltaic devices 101.

In step (i) of FIG. 6b a line/seam of a second glass frit paste 130 is deposited/applied around the periphery of the second glass sheet 103. In step (ii) of FIG. 6b the second glass sheet 103 is then placed in an oven/furnace and heated in order to thermally condition the second glass frit paste 130.

In step (i) of FIG. 6c the first glass sheet 102 on which the wall of compact glass 104 has been formed is aligned with the second glass sheet 103 such that the wall of compact glass 104 is in contact with the thermally conditioned second glass frit paste 130 provided around the periphery of the second glass sheet 103. In step (ii) of FIG. 6c the stacked components of the module 100 are then subjected to a lamination process in which pressure and heat is applied to the stacked components to melt the layer of interlayer/encapsulant material 109 such that the layer of interlayer/encapsulant material adheres to the plurality of photovoltaic devices 101 and to the internal surfaces of the two glass that are not covered by the plurality of photovoltaic devices 101. In step (iii) of FIG. 6c a laser beam is directed at the thermally conditioned second glass frit paste 130, and moved along the entire course/seam of thermally conditioned second glass frit paste 130, so as to melt the thermally conditioned second glass frit paste 130 in order to fuse/bond the second glass sheet 103 to the wall of compact glass 104 provided on the first glass sheet 102. The bond between the wall of compact glass 104 and each of the first glass sheet 102 and second glass sheet 103 therefore forms a hermetic seal around the entire periphery of the module 100. In step (iii) of FIG. 6c the laser beam is directed at the thermally conditioned second glass frit paste 130 through the second glass sheet 103 so that the laser beam does not have to pass through the wall of compact glass 104 formed on the first glass sheet 102.

Figure 7A:
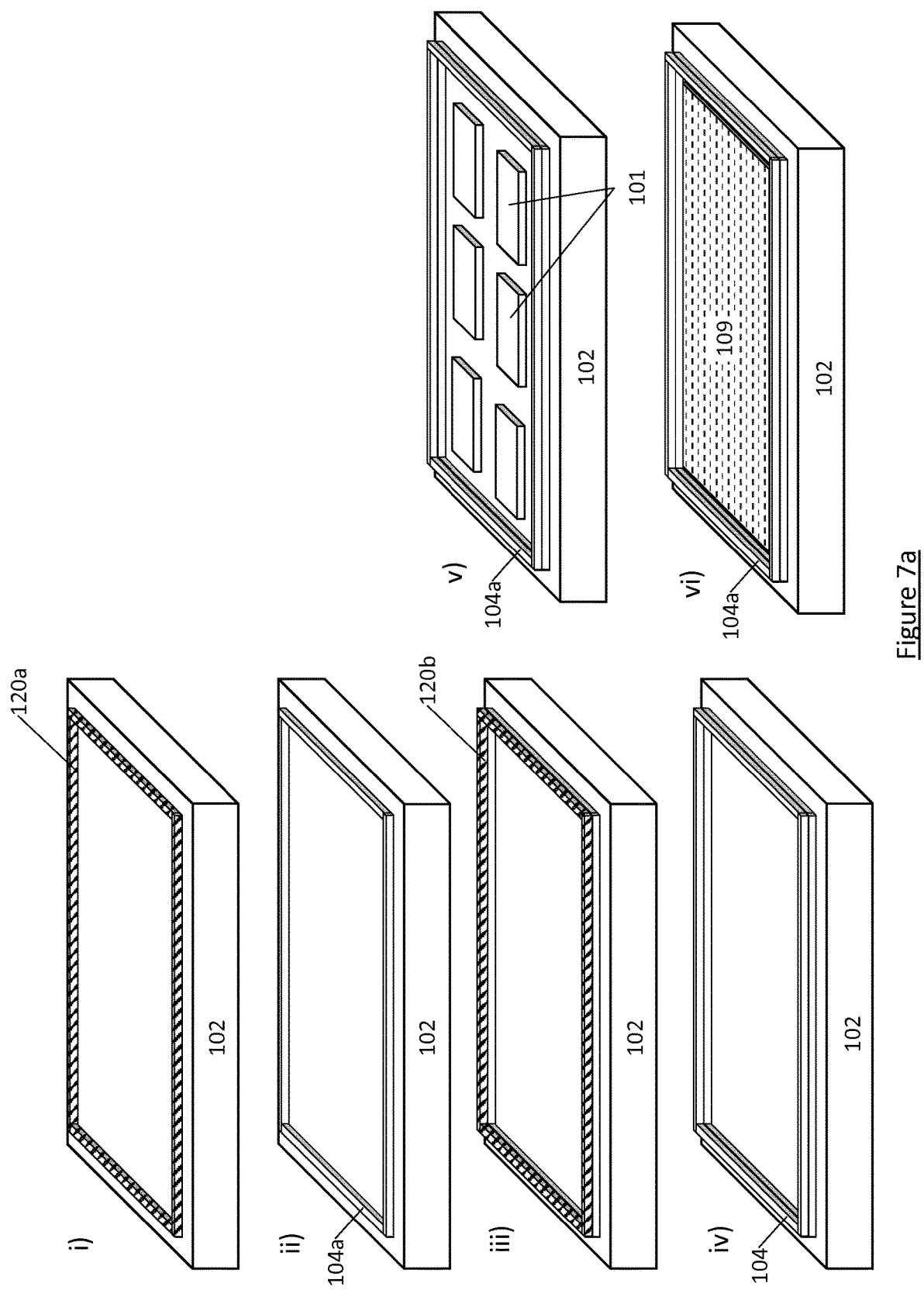
FIGS. 7a to 7c illustrate schematically a step-by-step implementation of a yet further alternative example of the method of encapsulating a photovoltaic module described herein.
Figure 7B:
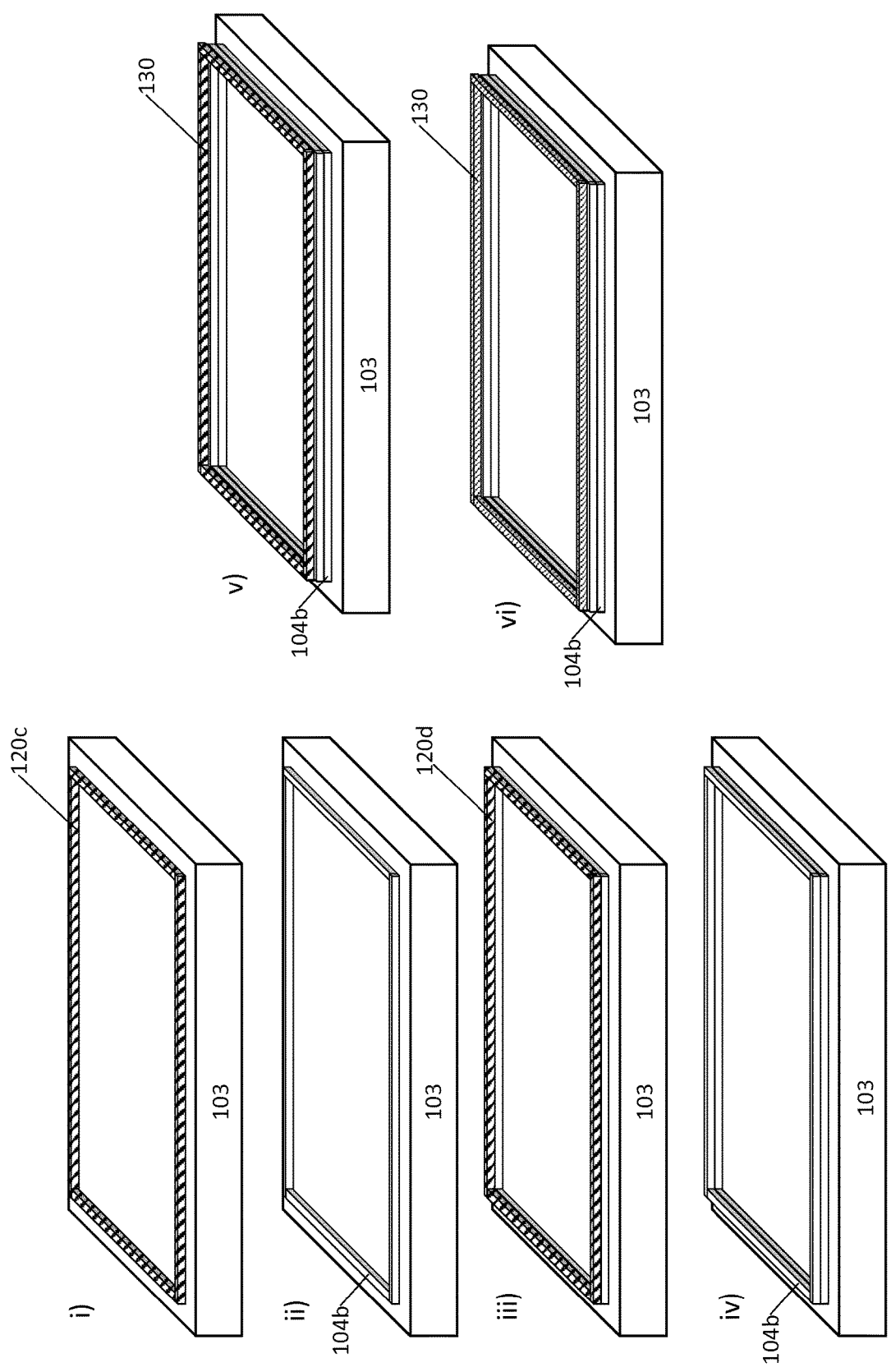
Figure 7C:
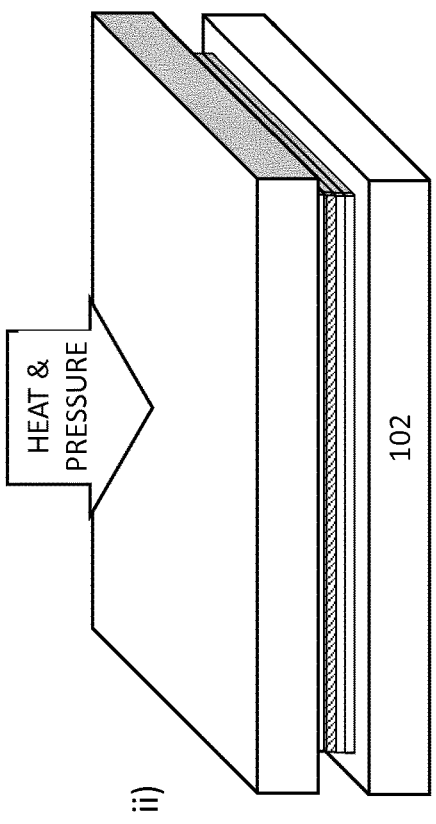
Figure 7C:
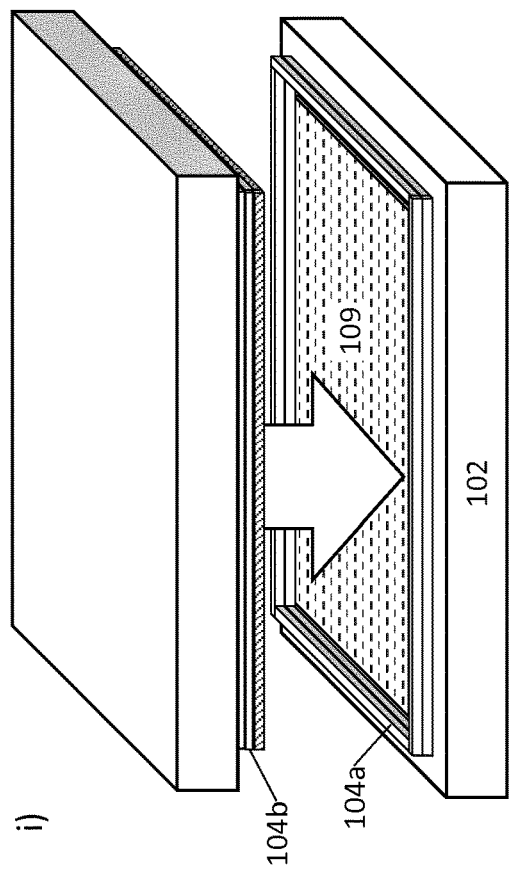
Figure 7C:
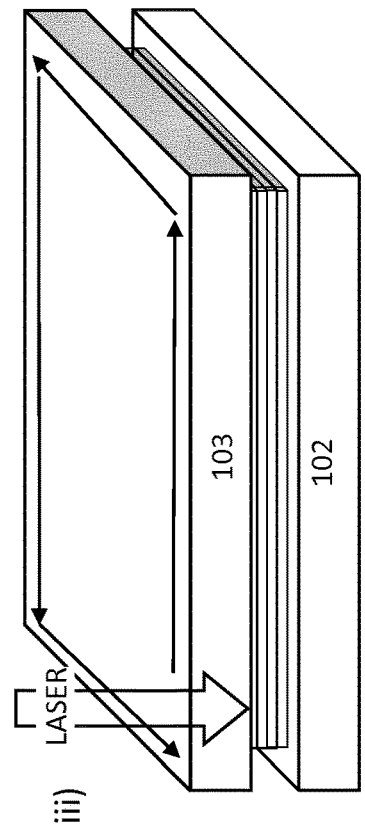

FIGS. 7a to 7c illustrate schematically a step-by-step implementation of a further alternative example of the method of encapsulating a photovoltaic module described herein.

In step (i) of FIG. 7a a course/seam of a first glass frit paste 120a is deposited/applied around the periphery of the first glass sheet 102. In step (ii) the first glass sheet 102 is then placed in an oven/furnace and heated in order to transform the course/seam of a first glass frit paste 120a provided around the periphery of the first glass sheet 102 into a first partial height wall of compact glass 104a. In step (iii) of FIG. 7a, an additional course/seam of the first glass frit paste 120b is then deposited/applied onto the first partial height wall of compact glass 104a that has been formed around the periphery of the first glass sheet 102. In step (iv) of FIG. 7a, the first glass sheet 102 is then again placed in an oven/furnace and heated in order to transform the additional course/seam of the first glass frit paste 120b provided on the first partial height wall of compact glass 104a into compact glass by the application of a time-temperature profile that is suitable for thermal conditioning and melting of the first glass frit paste 120. The application and thermal processing of an additional course/seam of the first glass frit paste 120b onto the first partial height wall of compact glass 104a thereby increases the overall height of/depth of the first partial height wall of compact glass 104a.

In step (v) of FIG. 7a the plurality of photovoltaic devices 101 are then located on the first glass sheet 102 by placing the plurality of photovoltaic devices 101 on the first glass sheet 102 within the area bound by the first partial height wall of compact glass 104a. In step (vi) of FIG. 6a, a layer of interlayer/encapsulant 109 is applied over the plurality of photovoltaic devices 101.

In step (i) of FIG. 7b a line/seam of a first glass frit paste 120c is deposited/applied around the periphery of the second glass sheet 103. In step (ii) the second glass sheet 103 is then placed in an oven/furnace and heated in order to transform the course/seam of a first glass frit paste 120c provided around the periphery of the second glass sheet 103 into a second partial height wall of compact glass 104b. In step (iii) of FIG. 7b, an additional course/seam of the first glass frit paste 120d is then deposited/applied onto the second partial height wall of compact glass 104b that has been formed around the periphery of the second glass sheet 103. In step (iv) of FIG. 7b, the second glass sheet 103 is then again placed in an oven/furnace and heated in order to transform the additional course/seam of the first glass frit paste 120d provided on the second partial height wall of compact glass 104b into compact glass by the application of a time-temperature profile that is suitable for thermal conditioning and melting of the first glass frit paste 120. The application and thermal processing of an additional course/seam of the first glass frit paste 120b onto the second partial height wall of compact glass 104b thereby increases the overall height of/depth of the second partial height wall of compact glass 104b.

In step (v) of FIG. 7b a line/seam of a second glass frit paste 130 is deposited/applied onto the second partial height wall of compact glass 104b. In step (vi) of FIG. 7b the second glass sheet 103 is then placed in an oven/furnace and heated in order to thermally condition the second glass frit paste 130.

In step (i) of FIG. 7c the first glass sheet 102 on which the first partial height wall of compact glass 104a has been formed is aligned with the second glass sheet 103 such that the first partial height wall of compact glass 104a is in contact with the thermally conditioned second glass frit paste 130 provided on the second partial height wall of compact glass 104b. In step (ii) of FIG. 7c the stacked components of the module 100 are then subjected to a lamination process in which pressure and heat is applied to the stacked components to melt the layer of interlayer/encapsulant material 109 such that the layer of interlayer/encapsulant material adheres to the plurality of photovoltaic devices 101 and to the internal surfaces of the two glass that are not covered by the plurality of photovoltaic devices 101. In step (iii) of FIG. 7c a laser beam is directed at the thermally conditioned second glass frit paste 130, and moved along the entire course/seam of thermally conditioned second glass frit paste 130, so as to melt the thermally conditioned second glass frit paste 130 in order to fuse/bond the second partial height wall of compact glass 104b formed on the second glass sheet 103 to the first partial height wall of compact glass 104a provided on the first glass sheet 102. The bond between the wall of compact glass 104 and each of the first glass sheet 102 and second glass sheet 103 therefore forms a hermetic seal around the entire periphery of the module 100.

In the examples described above with respect to FIGS. 5a to 5c, 6a to 6c and 7a to 7c, the method comprises the sequential formation of two lines/seams of compact glass, one on top of the other, around the periphery of the first glass sheet 102 and/or the second glass sheet. However, the formation of the wall of compact glass 104 could comprise just the formation of a single line of compact glass, or the sequential formation of several (i.e. more than two) lines of compact glass, one on top of the other. Forming a plurality of lines of compact glass, one on top of the other, increases the height of the wall of compact glass 104. It is therefore preferable that the wall of compact glass 104 is formed from at least two deposited lines of compact glass in order to ensure that the wall is of sufficient height as to provide a gap between the first sheet of glass 102 and second sheet of glass 103.

It will be appreciated that individual items described above may be used on their own or in combination with other items shown in the drawings or described in the description and that items mentioned in the same passage as each other or the same drawing as each other need not be used in combination with each other.

Furthermore, although the invention has been described in terms of preferred embodiments as set forth above, it should be understood that these embodiments are illustrative only. Those skilled in the art will be able to make modifications and alternatives in view of the disclosure which are contemplated as falling within the scope of the appended claims. For example, those skilled in the art will appreciate that whilst the above-described specific embodiments of the invention all relate to the encapsulation of a photovoltaic module comprising a plurality of photovoltaic devices located between two sheets of glass, the methods described herein are equally applicable to the encapsulation of any devices that are sensitive to moisture and that would be damaged by the high temperature typically used in conventional glass frit bonding processes. In particular, the methods described herein are equally applicable to the encapsulation of a plurality of optoelectronic devices between two sheets of glass. In this regard, the term "optoelectronic devices" includes photovoltaic devices, photodiodes (including solar cells), phototransistors, photomultipliers, photoresistors, and light emitting diodes etc. In particular, whilst in the above-described embodiments the photoactive perovskite material is used as a light absorber/photosensitizer, it may also function as light emitting material by accepting charge, both electrons and holes, which subsequently recombine and emit light.

The invention claimed is:

1. A method of encapsulating a photovoltaic module comprising a plurality of photovoltaic devices, the method comprising:

forming a wall of compact glass that extends from a periphery of a surface of a first glass sheet to a periphery of an opposing surface of a second glass sheet, the plurality of photovoltaic devices being located within a volume enclosed by the first glass sheet, the second glass sheet and the wall of compact glass, wherein the wall of compact glass is formed from a plurality of courses of glass frit; and sealing the enclosed volume using laser-assisted glass frit bonding.

2. The method according to claim 1, wherein the wall of compact glass is formed from a plurality of courses of glass frit that are individually transformed into compact glass by heating in an oven or furnace.

3. The method according to claim 1, wherein the distance extended by the wall is 50 µm or greater.

4. The method according to claim 1, wherein the method comprises any of:
forming a wall of compact glass on the first glass sheet and subsequently using laser-assisted glass frit bonding to fuse the wall of compact glass to the second glass sheet; and
forming a first partial height wall of compact glass on the first glass sheet, forming a second partial height wall of compact glass on the second glass sheet, and subsequently using laser-assisted glass frit bonding to fuse the first partial height wall of compact glass on the first glass sheet to the second partial height of compact glass on the second glass sheet.

5. The method according to claim 1, wherein the wall of compact glass is formed from a first glass frit paste, and the step of sealing the enclosed volume using laser-assisted glass frit bonding makes use of a second glass frit paste, wherein the first glass frit paste and second glass frit paste are the same or different.

6. A photovoltaic module comprising:
a wall of compact glass that extends from a periphery of a surface of a first glass sheet to a periphery of an opposing surface of a second glass sheet; and
a plurality of photovoltaic devices located within a volume enclosed by the first glass, the second glass sheet and the wall of compact glass;
wherein the wall of compact glass is formed from a plurality of courses of glass frit; and
wherein the distance extended by the wall of compact glass is 50 µm or greater.

7. The photovoltaic module according to claim 6, wherein the wall of compact glass is fused to the surface of the first glass sheet and to the opposing surface the second glass sheet.

8. The photovoltaic module according to claim 6, wherein the thickness of the wall of compact glass is less than 5 mm.

9. The photovoltaic module according to claim 6, wherein one or more of the plurality of photovoltaic devices are multi junction photovoltaic devices.

10. The photovoltaic module according to claim 6, wherein one or both of the first glass sheet and second glass sheet comprise a sheet of heat-strengthened or fully tempered glass and each of the plurality of photovoltaic devices.

11. The method according to claim 1, further comprising:
providing first and second glass sheets;
forming a wall of compact glass on the first glass sheet by
i) depositing a course of glass frit paste around a periphery of the surface of the first glass sheet, and transforming the glass frit paste into compact glass by heating the first glass sheet in an oven or furnace;
optionally increasing the height of the wall of compact glass by repeating i) at least once;
providing a course of thermally conditioned glass frit paste on one of either the wall of compact glass formed on the first glass sheet or around the periphery of the second glass sheet;

locating a plurality of photovoltaic devices either on the first glass sheet after the step of providing thermally conditioned glass frit paste on the wall of compact glass; or on the second glass sheet; or on the first glass sheet after the step of forming a wall of compact glass around the periphery of the first glass sheet; or on the second glass sheet after the step of providing thermally conditioned glass frit paste around the periphery of the second glass sheet;

aligning the first glass sheet with the second glass sheet such that either the thermally conditioned glass frit paste provided on the wall of compact glass formed on the first glass sheet is in contact with the periphery of the second glass sheet, or the wall of compact glass formed on the first glass sheet is in contact with the thermally conditioned glass frit paste provided around the periphery of the second glass sheet; and applying laser-assisted glass frit bonding to fuse the wall of compact glass formed on the first sheet to the second glass sheet by directing a laser at the thermally conditioned glass frit paste.

12. The method according to claim 1, further comprising:
providing first and second glass sheets;
forming a first partial height wall of compact glass on the first glass sheet by i) depositing a course of glass frit paste around a periphery of the surface of the first glass sheet, and transforming the glass frit paste into compact glass by heating the first glass sheet in an oven or furnace;
forming a second partial height wall of compact glass on the second glass sheet by ii) depositing a course of glass frit paste around a periphery of the opposing surface of the second glass sheet, and transforming the glass frit paste into compact glass by heating the second glass sheet in an oven or furnace;
optionally repeating one or both of i) and ii) at least once;
providing a course of thermally conditioned glass frit paste on one of the first partial height wall of compact glass and the second partial height wall of compact glass;
locating a plurality of photovoltaic devices on one of the first glass sheet and the second glass sheet;
aligning the first glass sheet with the second glass sheet such that the first partial height wall of compact glass is in contact with the second partial height wall of compact glass;
applying laser-assisted glass frit bonding to fuse the first partial height wall of compact glass to the second partial height wall of compact glass by directing a laser at the thermally conditioned glass frit paste.

13. The method according to claim 11, wherein a layer of encapsulant material is applied over the plurality of photovoltaic devices.

14. The method according to claim 12, wherein a layer of encapsulant material is applied over the plurality of photovoltaic devices.

15. The method according to claim 11, wherein a first layer of encapsulant material is applied on one of the surface of the first glass sheet and the opposing surface of the second glass sheet; the plurality of photovoltaic devices are then located on the first layer of encapsulant material; and a second layer of encapsulant material is applied over the plurality of photovoltaic devices.

16. The method according to claim 12, wherein a first layer of encapsulant material is applied on one of the surface of the first glass sheet and the opposing surface of the second glass sheet; the plurality of photovoltaic devices are then located on the first layer of encapsulant material; and a second layer of encapsulant material is applied over the plurality of photovoltaic devices.

17. The method according to claim 13, wherein following the step of aligning the first and second glass sheets, the photovoltaic module is subjected to a lamination process.

18. The method according to claim 14, wherein following the step of aligning the first and second glass sheets, the photovoltaic module is subjected to a lamination process.

19. The method according to claim 15, wherein following the step of aligning the first and second glass sheets, the photovoltaic module is subjected to a lamination process.

20. The method according to claim 16, wherein following the step of aligning the first and second glass sheets, the photovoltaic module is subjected to a lamination process.

21. The photovoltaic module according to claim 9, wherein the plurality of photovoltaic devices are bonded to both the first glass sheet and the second glass sheet by at least one layer of encapsulant material.

22. The photovoltaic module according to claim 10, wherein the plurality of photovoltaic devices are formed directly on one of the surface of the first glass sheet and the opposing surface of the second glass sheet.

\* \* \* \* \*